US012647113B2

(12) United States Patent
Le et al.

(10) Patent No.: US 12,647,113 B2
(45) Date of Patent: Jun. 2, 2026

(54) METHODS AND APPARATUS TO DRIVE SOLID-STATE RELAY CIRCUITRY

(71) Applicant: Texas Instruments Incorporated, Dallas, TX (US)

(72) Inventors: Kelvin Le, Dallas, TX (US); Saleh Ahmad, Dallas, TX (US); Riccardo Ruffo, Munich (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 126 days.

(21) Appl. No.: 18/373,688

(22) Filed: Sep. 27, 2023

(65) Prior Publication Data

US 2024/0340005 A1     Oct. 10, 2024

Related U.S. Application Data

(60) Provisional application No. 63/457,264, filed on Apr. 5, 2023.

(51) Int. Cl.
H03K 17/687         (2006.01)

(52) U.S. Cl.
CPC ................................. H03K 17/6871 (2013.01)

(58) Field of Classification Search
CPC .................................................. H03K 17/6871
See application file for complete search history.

(56) References Cited

U.S. PATENT DOCUMENTS

| | | | |
|---|---|---|---|
| 4,170,740 A | 10/1979 | Pernyeszi | |
| 4,487,458 A * | 12/1984 | Janutka | H03K 17/102 |
| | | | 327/575 |
| 6,815,845 B1 * | 11/2004 | McCallum | H02M 7/5387 |
| | | | 361/84 |
| 2018/0302085 A1 | 10/2018 | Xie | |

FOREIGN PATENT DOCUMENTS

DE     102009017543 A1     10/2010

OTHER PUBLICATIONS

International Search Report mailed Jul. 10, 2024.

* cited by examiner

*Primary Examiner* — Metasebia T Retebo
(74) *Attorney, Agent, or Firm* — Frank D. Cimino

(57)          ABSTRACT

An example apparatus includes: a first transistor having a first terminal and a control terminal; a second transistor having a first terminal and a control terminal, the first terminal of the second transistor coupled to the first terminal of the first transistor, the control terminal of the second transistor coupled to the control terminal of the first transistor; a resistor having a first terminal and a second terminal, the first terminal of the resistor coupled to the first terminal of the first transistor and the first terminal of the second transistor, the second terminal of the resistor coupled to the control terminal of the first transistor and the control terminal of the second transistor; and a diode having a first terminal and a second terminal, the first terminal of the diode coupled to the control terminal of the first transistor and the control terminal of the second transistor.

18 Claims, 8 Drawing Sheets

400

700

START

710 DOES A LOAD NEED POWER?

NO

YES

720 ENABLE FET STACK CIRCUITRY TO SUPPLY POWER TO THE LOAD

730 DISABLE KICK-BACK SOLID-STATE RELAY CIRCUITRY

740 DIVIDE A SUPPLY VOLTAGE ACROSS FETS OF THE FET STACK CIRCUITRY

750 SUPPLY POWER TO THE LOAD

DOES THE LOAD STILL NEED POWER?

YES

760

NO

770 DISABLE THE FET STACK CIRCUITRY

780 ENABLE KICK-BACK SOLID-STATE RELAY CIRCUITRY

METHODS AND APPARATUS TO DRIVE SOLID-STATE RELAY CIRCUITRY

CROSS-REFERENCE TO RELATED APPLICATION

This patent application claims the benefit of and priority to U.S. Provisional patent application Ser. No. 63/457,264 filed Apr. 5, 2023, which is hereby incorporated herein by reference in its entirety.

TECHNICAL FIELD

This description relates generally to relay circuitry and, more particularly, to methods and apparatus to drive solid-state relay circuitry.

BACKGROUND

Electronic systems include protection circuitry capable of protecting complex circuitry from hazardous operating conditions. One example of protection circuitry is relay circuitry. Relay circuitry is in-line circuitry between a power source and a load that is capable of controlling the supply of power from the power source to the load. Relay circuitry utilizes mechanical or electro-mechanical components to control the supply of power to the load.

SUMMARY

For methods and apparatus to drive solid-state relay circuitry, an example apparatus includes a first transistor having a first terminal and a control terminal; a second transistor having a first terminal and a control terminal, the first terminal of the second transistor coupled to the first terminal of the first transistor, the control terminal of the second transistor coupled to the control terminal of the first transistor; a resistor having a first terminal and a second terminal, the first terminal of the resistor coupled to the first terminal of the first transistor and the first terminal of the second transistor, the second terminal of the resistor coupled to the control terminal of the first transistor and the control terminal of the second transistor; a diode having a first terminal and a second terminal, the first terminal of the diode coupled to the control terminal of the first transistor and the control terminal of the second transistor; and driver circuitry having a terminal coupled to the second terminal of the diode.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
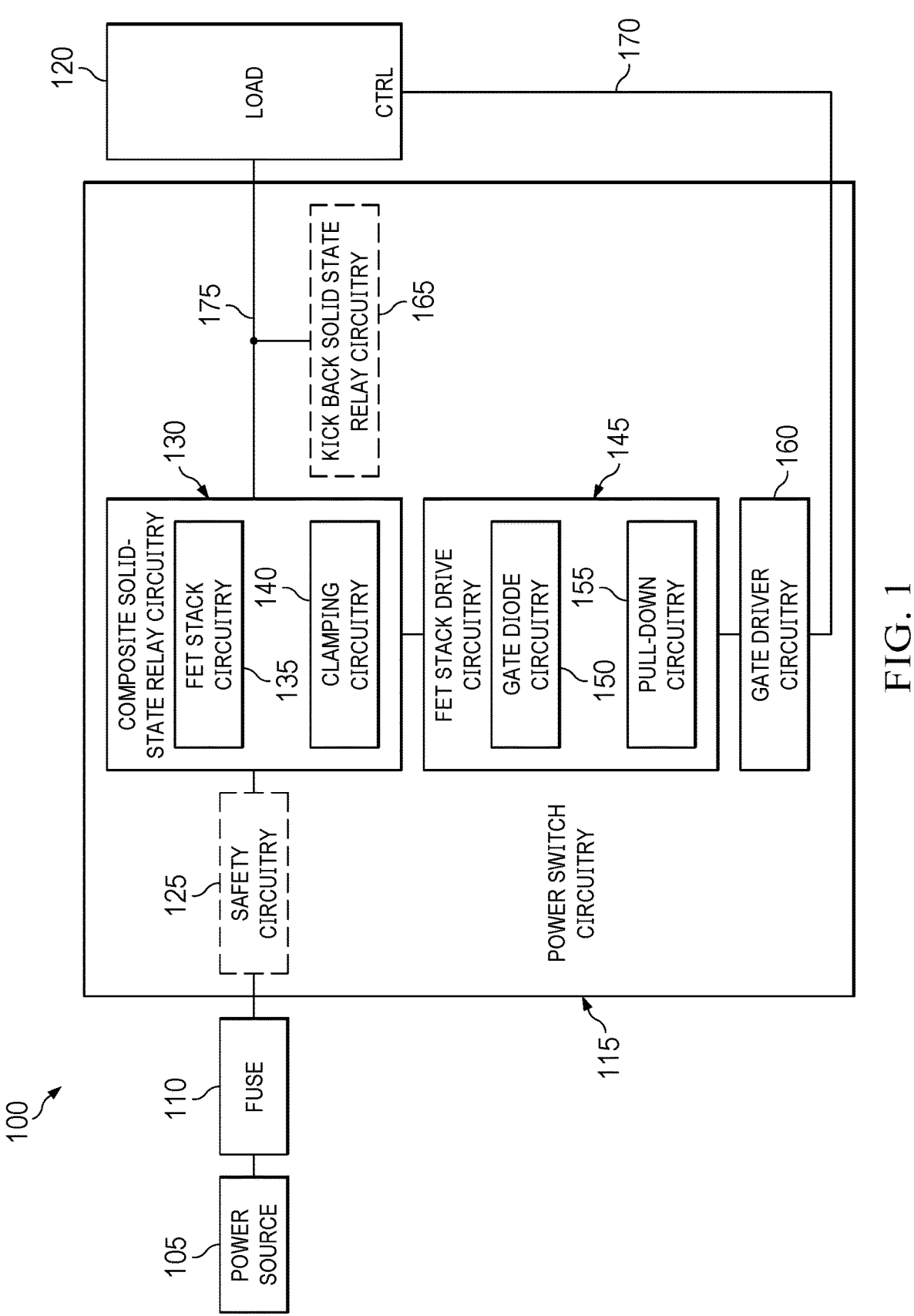
FIG. 1 is a block diagram of an example power supply system including example power switch circuitry to control a supply of power from an example power source to an example load.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

Electronic systems include protection circuitry capable of protecting complex circuitry from hazardous operating conditions. In some devices, relay circuitry allows mechanical and/or electro-mechanical components to control the supply of power to a load. Relay circuitry is in-line circuitry between the power source and the load that controls the supply of power from the power source to the load. Relay circuitry couples the load to the power source.

Some devices utilize electro-mechanical relay (EMR) circuitry to disconnect mechanically the load from the power source. EMR circuitry creates a physical gap between the load and the power source to interrupt the flow of power to the load. However, relatively high voltages may result in arcing. In some devices, zero voltage switching (ZVS) prevents arcing from shorting the EMR circuitry. ZVS is a method of timing a switching of the relay circuitry to occur at zero voltage crossings of the power source. In AC systems, implementing ZVS requires that the EMR circuitry delay disconnection of the load by a half a cycle of the power supply.

Other devices utilize solid-state relay (SSR) circuitry to disconnect electrically the load and power source to interrupt the flow of power to the load. SSR circuitry utilizes circuitry in the form of a semiconductor device that disconnects the power source from the load, without needing to time the disconnection with a zero-voltage crossing of the power source. However, components of the SSR circuitry must be capable of safely handling stress resulting from relatively high voltages being applied. Such a capability typically results in increased size and/or cost of the SSR circuitry.

Examples described herein include methods and apparatus to drive solid-state relay (SSR) circuitry. In some described examples, power switch circuitry utilizes field-effect transistor (FET) stack circuitry and clamping diodes to form composite SSR circuitry. The composite SSR circuitry described herein utilizes a plurality of relatively low voltage FETs that are capable of relatively high-speed switching. Further, stacking the plurality of relatively low voltage FETs with a plurality of diodes and pull-down resistors allows the composite SSR circuitry to be controlled using a single instance of gate driver circuitry. Advantageously, the power switch circuitry described herein utilizes FET stack circuitry to create composite SSR circuitry capable of active clamping.

FIG. 1 is a block diagram of an example power supply system 100. In the example of FIG. 1, the power supply system 100 includes an example power source 105, an example fuse 110, example power switch circuitry 115, and an example load 120. The power supply system 100 is an example system configured to supply power from the power source 105 to the load 120.

The power source 105 is coupled to the fuse 110. The power source 105 supplies power to the power switch circuitry 115 by the fuse 110. In some examples, the power source 105 is an AC power source. For example, the power source 105 may be a grid connection (e.g., 110 VAC). In such an example, the power source 105 supplies an AC signal to the fuse 110. In other examples, the power source 105 is a DC power source. For example, the power source 105 may be an energy storage device, such as a battery. In such examples, the power source 105 supplies a DC signal to the fuse 110.

The fuse 110 is coupled to the power source 105 and the power switch circuitry 115. The fuse 110 is a safety mechanism configured to prevent currents over a current limit from being supplied to the power switch circuitry 115. The fuse 110 allows current to flow from the power source 105 to the power switch circuitry 115 when the current is less than the current limit. The fuse 110 prevents a current from flowing from the power source 105 to the power switch circuitry 115 when the current is greater than or equal to the current limit. In some examples, the fuse 110 is an electro-mechanical component that disconnects the power source 105 from the power switch circuitry 115 responsive to a current greater than the current limit.

Although in the example of FIG. 1, the fuse 110 is illustrated, in some examples, the power source 105 may be coupled directly to the power switch circuitry 115. However, some systems, such as the power supply system 100, include redundant safety features (e.g., the fuse 110 and/or the power switch circuitry 115) to increase reliability.

The power switch circuitry 115 is coupled to the fuse 110 and the load 120. In the example of FIG. 1, the power switch circuitry 115 includes example safety circuitry 125, example composite SSR circuitry 130, example FET stack circuitry 135, example clamping circuitry 140, example FET stack drive circuitry 145, example gate diode circuitry 150, example pull-down circuitry 155, example gate driver circuitry 160, and example kick back SSR circuitry 165. The power switch circuitry 115 allows relatively lower power circuitry to control the supply of power to the load 120. When enabled, the power switch circuitry 115 allows current to flow from the power source 105 to the load 120 and when disabled prevents current from flowing to the load 120.

In some examples, the power switch circuitry 115 allows relatively low voltage circuitry (e.g., microcontroller circuitry, programmable circuitry, general-purpose input/output (GPIOs) terminals, etc.) to control a supply of power at relatively higher voltages. For example, a control signal (CRTL) on line 170 from the load 120 may be a relatively low voltage signal, while the power source 105 supplies a relatively high voltage signal to the load 120 on line 175. In such an example, a logic level (e.g., a logical high or a logical low) of the control signal may control a supply power to the load 120.

The load 120 is coupled to the power switch circuitry 115 via lines 170, 175. Although in the example of FIG. 1, the load 120 is coupled directly to the power switch circuitry 115, the power supply system 100 may be modified to include additional circuitry. The load 120 receives power from the power switch circuitry 115 on line 175. In some examples, the load 120 controls the supply of power from the power switch circuitry 115 via line 170. In some such examples, the load 120 may disable the supply of power responsive to a determination that power is no longer needed. For example, the load 120 may disable the power switch circuitry 115 responsive to a determination that a battery, internal to the load 120, is fully charged. In another example, the load 120 may disable the power switch circuitry 115 responsive to a power down sequence (e.g., turning the load 120 off). Alternatively, the power switch circuitry 115 may be controlled by circuitry external to the load 120. For example, the load 120 may be a battery charging system. In such an example, the battery charging system disables the supply of power once the battery is fully charged.

The safety circuitry 125 is coupled to the fuse 110 and the composite SSR circuitry 130. The safety circuitry 125 is configured to create an open circuit when a current and/or voltage greater than a maximum current and/or voltage is supplied. In some examples, the safety circuitry 125 is a component configured to disconnect the line 175 from the power source 105 when the maximum current and/or voltage is supplied. The safety circuitry 125 creates an open circuit between the fuse 110 and the composite SSR circuitry 130 responsive to excessive power from the power source 105. Such an operation may be referred to as failing open. Advantageously, the safety circuitry 125 creates an open circuit that physically prevents the composite SSR circuitry 130 from exposure to excessive currents and/or voltages.

Although in the example of FIG. 1, the safety circuitry 125 is illustrated, in some examples, the power source 105 may be coupled directly to the composite SSR circuitry 130. However, some systems, such as the power supply system 100, include redundant safety features (e.g., the safety circuitry 125) to increase reliability.

The composite SSR circuitry 130 is coupled to the load 120, the safety circuitry 125, the FET stack drive circuitry 145, and the kick back SSR circuitry 165. In the example of FIG. 1, the composite SSR circuitry 130 includes the FET stack circuitry 135 and the clamping circuitry 140. The composite SSR circuitry 130 forms a solid-state relay that controls a supply of power from the power source 105 to the load 120. The composite SSR circuitry 130 allows power to be supplied to the load 120 when the composite SSR circuitry 130 is turned on (e.g., enabled, conducting). The composite SSR circuitry 130 prevents power from being supplied to the load when the composite SSR circuitry 130 is turned off (e.g., disabled, non-conducting). The composite SSR circuitry 130 has an on and off state of operation, which is controlled by the FET stack drive circuitry 145 and the gate driver circuitry 160.

Figure 2A:
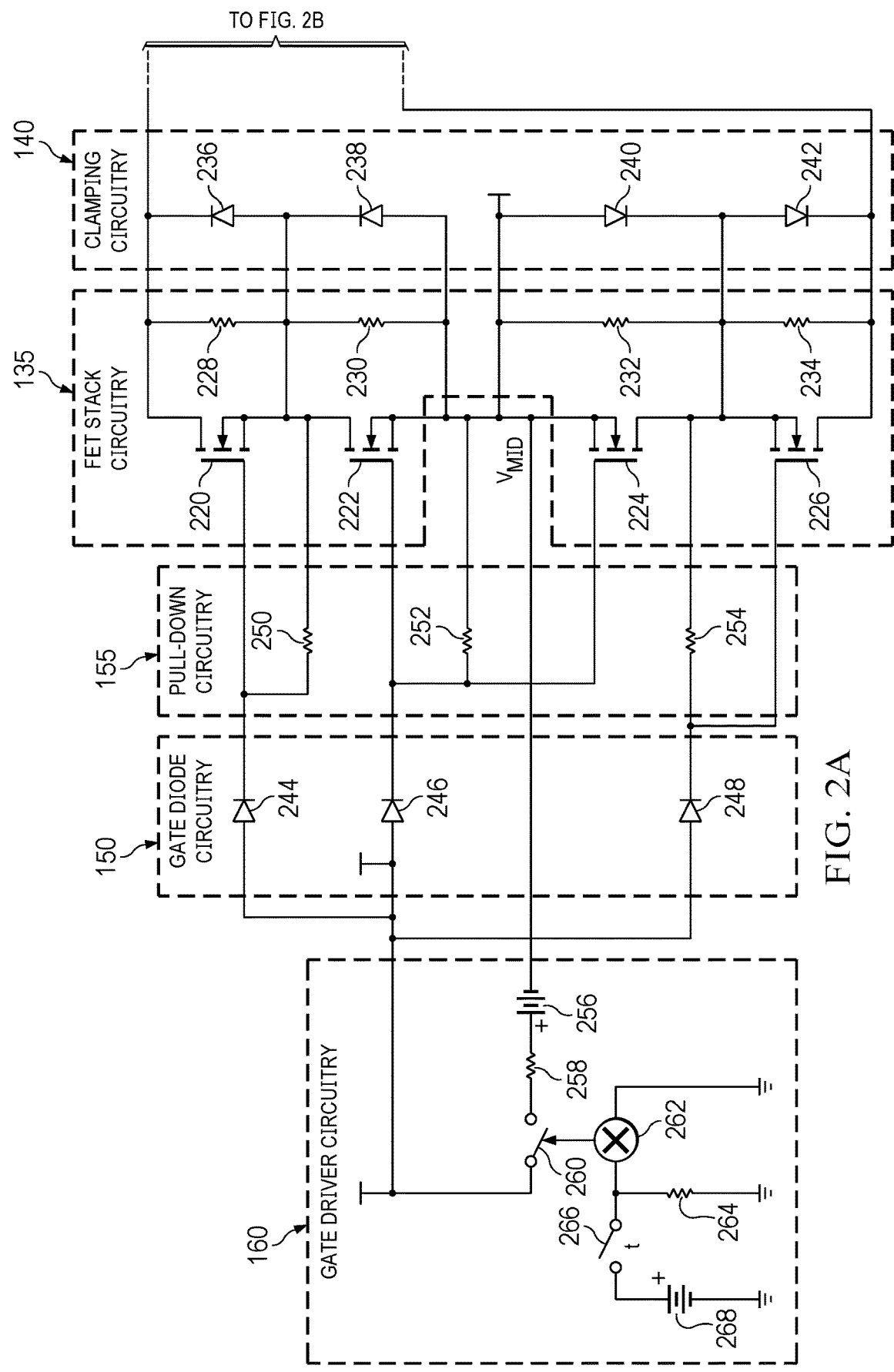
FIGS. 2A and 2B form a schematic diagram of the example power supply system of FIG. 1 including example solid-state relay circuitry to control a supply of power from the power source to the example load.

As described in the examples below, the FET stack circuitry 135 includes a plurality of FETs coupled in series. The FET stack circuitry 135 distributes a supply voltage, from the power source 105, across the plurality of FETs to reduce the total voltage applied across any given FET. In some examples, the FET stack circuitry 135 includes voltage divider circuitry, as shown in FIG. 2A, to balance the distribution of the supply voltage across the FET stack circuitry 135. The FET stack circuitry 135 is controlled by the FET stack drive circuitry 145. The plurality of FETs of the FET stack circuitry 135 allow power to be supplied to the load 120 when turned on (e.g., enabled, conducting). The plurality of FETs of the FET stack circuitry 135 prevent power from being supplied to the load 120 when turned off (e.g., disabled, non-conducting). An example implementation of the FET stack circuitry 135 is illustrated in FIG. 2A, below.

The clamping circuitry 140 regulates the FET stack circuitry 135. The clamping circuitry 140 ensures that the source voltages of the plurality of FETs of the FET stack circuitry 135 are approximately equal while turning on the FET stack circuitry 135. In some examples, the clamping circuitry 140 uses a plurality of diodes enables the plurality of FETs of the FET stack circuitry 135 turn on at approximately the same time, during hard turn on. In such examples, the plurality of diodes of the clamping circuitry 140 balance the voltage stress applied across the FETs of the FET stack circuitry 135. In some examples, diodes of the clamping circuitry are configured to protect the FETs of the FET stack circuitry 135 because the diodes break down responsive to spikes in the transient voltages. In such examples, breaking down the diodes of the clamping circuitry 140 prevents exposing the FET stack circuitry 135 to excessive voltages. An example implementation of the clamping circuitry 140 is illustrated and described in FIG. 2A, below.

The FET stack drive circuitry 145 is coupled to the composite SSR circuitry 130 and the gate driver circuitry 160. In the example of FIG. 1, the FET stack drive circuitry 145 includes the gate diode circuitry 150 and the pull-down circuitry 155. The FET stack drive circuitry 145 allows a single isolated gate driver, such as the gate driver circuitry 160, to control the composite SSR circuitry 130. The FET stack drive circuitry 145 configures the composite SSR circuitry 130 for turn on and turn off conditions. In some examples, the FET stack drive circuitry 145 turns on (e.g., enables) the composite SSR circuitry 130 responsive to a first reference voltage. In such examples, the FET stack drive circuitry 145 turns off (e.g., disables) the composite SSR circuitry 130 responsive to a second reference voltage.

The gate diode circuitry 150 receives a current from the gate driver circuitry 160. The gate diode circuitry 150 supplies the current to the FETs of the FET stack circuitry 135. The gate diode circuitry 150 prevents the source voltages of the FET stack circuitry 135 from unevenly disabling and/or enabling the FET stack circuitry 135. In some examples, the gate diode circuitry 150 utilizes a plurality of diodes to ensure the FETs of the FET stack circuitry 135 are disabled at approximately the same time. An example implementation of the gate diode circuitry 150 is illustrated and described in FIG. 2A, below.

The pull-down circuitry 155 receives the current from the gate diode circuitry 150. The pull-down circuitry 155 generates gate-to-source voltages to control the FET stack circuitry 135 responsive to the current from the gate diode circuitry 150. The pull-down circuitry 155 ensures that the control voltage from the gate driver circuitry 160 enables the FET stack circuitry 135. In some examples, the pull-down circuitry 155 utilizes a plurality of resistors to ensure the FETs of the FET stack circuitry 135 turn off responsive to a lack of current from the gate diode circuitry 150. In such examples, the plurality of resistors set the gate voltages of the FET stack circuitry 135 approximately equal to the source voltage, disabling the FETs. Such resistors may be referred to as pull-down resistors. An example implementation of the pull-down circuitry 155 is illustrated in FIG. 2A, below.

The gate driver circuitry 160 is coupled to the load 120 and the FET stack drive circuitry 145. The gate driver circuitry 160 is an isolated gate driver. The gate driver circuitry 160 controls the composite SSR circuitry 130 using the FET stack drive circuitry 145. The gate driver circuitry 160 turns on and turns off the composite SSR circuitry 130 to control the supply of power to the load 120. In some examples, the gate driver circuitry 160 turns on the composite SSR circuitry 130 by supplying a first reference voltage to the FET stack drive circuitry 145. In such examples, the gate driver circuitry 160 turns off the composite SSR circuitry 130 by supplying a second reference voltage to the FET stack drive circuitry 145.

The kick back SSR circuitry 165 is coupled to the load 120 and the composite SSR circuitry 130. The kick back SSR circuitry 165 is a secondary solid-state relay. The kick back SSR circuitry 165 is enabled responsive to disabling the composite SSR circuitry 130. The kick back SSR circuitry 165 allows inductive components of the load 120 to discharge current into the power switch circuitry 115 without increasing the voltage difference across the composite SSR circuitry 130. Advantageously, the kick back SSR circuitry 165 prevents inductive components of the load 120 from creating relatively large voltages differences across the composite SSR circuitry 130.

Although in the example of FIG. 1, the kick back SSR circuitry 165 is illustrated, in some examples, the power switch circuitry 115 may be modified to remove and/or modify the kick back SSR circuitry 165. For example, removing the kick back SSR circuitry 165 when the load 120 does not include an inductive component. However, some systems, such as the power supply system 100, include the kick back SSR circuitry 165 to increase reliability.

Figure 2B:
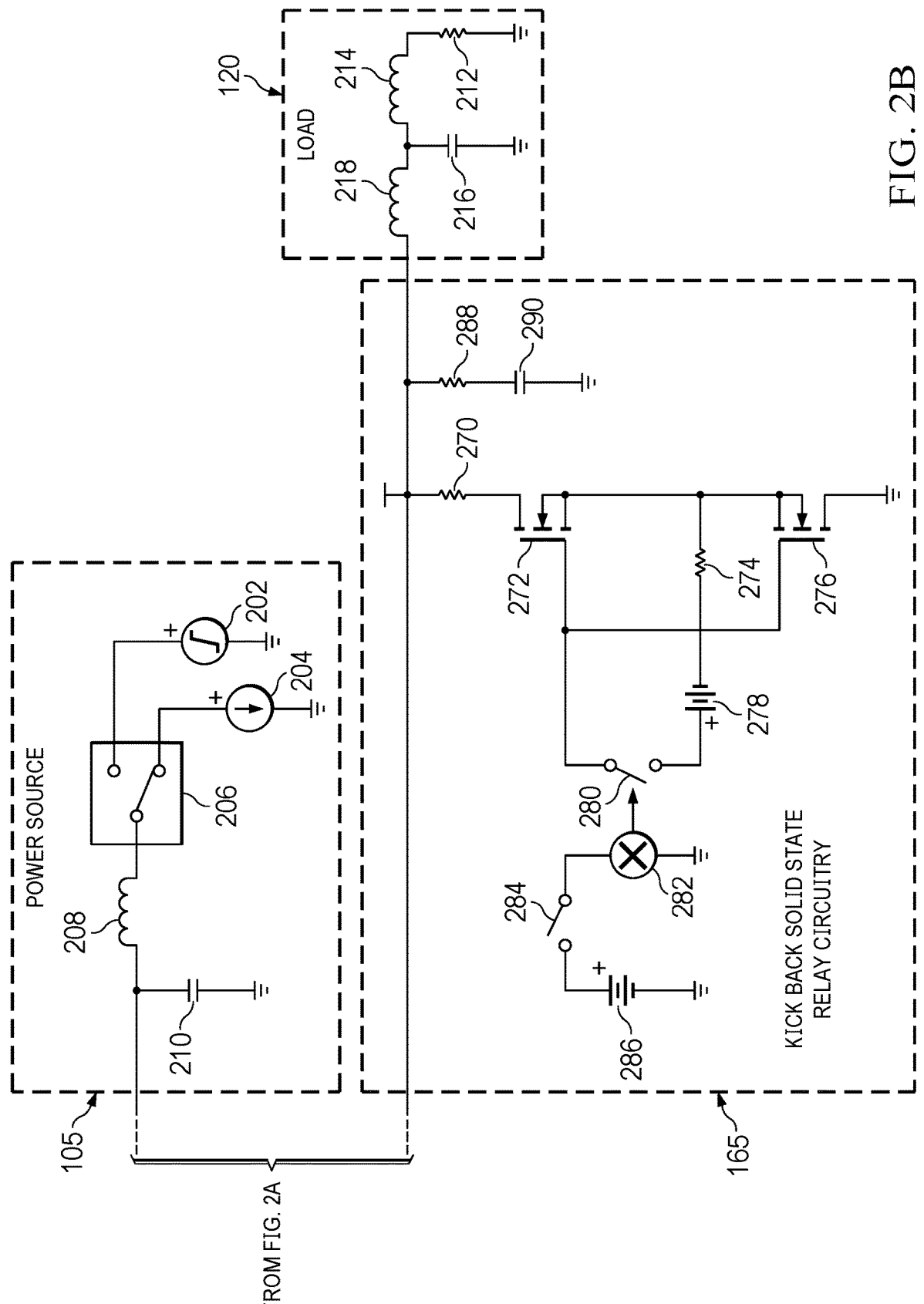

FIGS. 2A and 2B form a schematic diagram of the example power supply system 100 of FIG. 1. In the example of FIGS. 2A and 2B, the example power supply system 100 includes the power source 105 of FIG. 1, the load 120 of FIG. 1, the FET stack circuitry 135 of FIG. 1, the clamping circuitry 140 of FIG. 1, the gate diode circuitry 150 of FIG. 1, the pull-down circuitry 155 of FIG. 1, the gate driver circuitry 160 of FIG. 1, and the kick back SSR circuitry 165 of FIG. 1.

In the example of FIG. 2B, the power source 105 includes first example supply circuitry 202, second example supply circuitry 204, a first example switch 206, a first example inductor 208, and a first example capacitor 210. In the example of FIG. 2B, the load 120 includes a first example resistor 212, a second example inductor 214, a second example capacitor 216, and a third example inductor 218.

In the example of FIG. 2A, the FET stack circuitry 135 includes a first example transistor 220, a second example transistor 222, a third example transistor 224, a fourth example transistor 226, a second example resistor 228, a third example resistor 230, a fourth example resistor 232, and a fifth example resistor 234. In the example of FIG. 2A, the clamping circuitry 140 includes a first example diode 236, a second example diode 238, a third example diode 240, and a fourth example diode 242.

In the example of FIG. 2A, the gate diode circuitry 150 includes a fifth example diode 244, a sixth example diode 246, and a seventh example diode 248. In the example of FIG. 2A, the pull-down circuitry 155 includes a sixth example resistor 250, a seventh example resistor 252, and an eighth example resistor 254.

In the example of FIG. 2A, the gate driver circuitry 160 includes first example voltage source circuitry 256, a ninth example resistor 258, a second example switch 260, first example switch control circuitry 262, a tenth example resistor 264, a third example switch 266, and second example voltage source circuitry 268.

In the example of FIG. 2B, the kick back SSR circuitry 165 includes an eleventh example resistor 270, a fifth example transistor 272, a twelfth example resistor 274, a sixth example transistor 276, third example voltage source circuitry 278, a fourth example switch 280, second example switch control circuitry 282, a fifth example switch 284, fourth example voltage source circuitry 286, a thirteenth example resistor 288, and a third example capacitor 290.

The first supply circuitry 202 has a first terminal coupled to the first switch 206. The first supply circuitry 202 has a second terminal coupled to a common terminal that supplies a common potential (e.g., ground). The first supply circuitry 202 supplies an AC signal to the first switch 206.

The second supply circuitry 204 has a first terminal coupled to the first switch 206. The second supply circuitry 204 has a second terminal coupled to the common terminal that supplies the common potential. The second supply circuitry 204 supplies a DC signal to first switch 206.

The first switch 206 has a first terminal coupled to the first supply circuitry 202. The first switch 206 has a second terminal coupled to the second supply circuitry 204. The first switch 206 has a third terminal coupled to the first inductor 208. The first switch 206 couples one of the supply circuitries 202, 204 to the first inductor 208. In some examples, the first switch 206 couples the first supply circuitry 202 to the first inductor 208 to supply the AC signal to the load 120. In other examples, the first switch 206 couples the second supply circuitry 204 to the first inductor 208 to supply the DC signal to the load 120. Although in the example of FIG. 2B, the power source 105 includes both of the supply circuitries 202 and 204, in some examples the power source 105 may be configured to supply one of the AC or DC signals. For example, when the power source 105 represents a grid connection, the first supply circuitry 202 may be directly coupled to the first inductor 208, the FET stack circuitry 135, and/or the clamping circuitry 140.

The first inductor 208 has a first terminal coupled to the first switch 206. The first inductor 208 has a second terminal coupled to the first capacitor 210, the FET stack circuitry 135, and the clamping circuitry 140. The first inductor 208 receives an AC or DC signal from the first switch 206. The first inductor 208 supplies a supply signal to the first capacitor 210, the FET stack circuitry 135 and the clamping circuitry 140. In some examples, the first inductor 208 represents an inductance of a connector coupling the FET stack circuitry 135 and the clamping circuitry 140 to the power source 105. Although in the example of FIG. 2B the first inductor 208 is illustrated, the power source 105 may be modified to remove and/or include one or more additional circuit elements.

The first capacitor 210 has a first terminal coupled to the first inductor 208, the FET stack circuitry 135, and the clamping circuitry 140. The first capacitor 210 has a second terminal coupled to the common terminal that supplies the common potential. The first capacitor 210 receives the supply signal from the first inductor 208. In some examples, the first capacitor 210 averages relatively high frequency noise of the supply signal by resisting relatively high frequency changes. In other examples, the first capacitor 210 is a capacitive characteristic of the power source 105.

The first resistor 212 has a first terminal coupled to the second inductor 214. The first resistor 212 has a second terminal coupled to the common terminal that supplies the common potential. The first resistor 212 represents a resistive component of the load 120. In some examples, the first resistor 212 may be referred to as a load resistor. Although in the example of FIG. 2B, the first resistor 212 is illustrated the load 120 may be modified in accordance with the description herein to include one or more additional circuit elements. For example, replacing the first resistor 212 with alternative circuitry.

The second inductor 214 has a first terminal coupled to the first resistor 212. The second inductor 214 has a second terminal coupled to the second capacitor 216 and the third inductor 218. The second inductor 214 represents an inductive component of the load 120. In some examples, the second inductor 214 may be generalized using an impedance representative of the load 120. Although in the example of FIG. 2B, the second inductor 214 is illustrated the load 120 may be illustrated and/or described, in accordance with the description herein, as an impedance of the load 120.

The second capacitor 216 has a first terminal coupled to the inductors 214 and 218. The second capacitor 216 has a second terminal coupled to the common terminal that supplies the common potential. The second capacitor 216 receives the supply signal from the third inductor 218. In some examples, the second capacitor 216 averages relatively high frequency noise of the supply signal. In other examples, the second capacitor 216 is a capacitive component of a connector coupling the load 120 to the FET stack circuitry 135, the clamping circuitry 140, and the kick back SSR circuitry 165. In yet another example, the second capacitor 216 represents a capacitive component of the load 120. In such examples, the second capacitor 216 may be generalized using an impedance representative of the load 120. Although in the example of FIG. 2B, the second capacitor 216 is illustrated as a capacitance, the load 120 may be illustrated and/or described, in accordance with the description herein, as an impedance of the load 120.

The third inductor 218 has a first terminal coupled to the second inductor 214 and the second capacitor 216. The third inductor 218 has a second terminal coupled to coupling the FET stack circuitry 135, the clamping circuitry 140, and the kick back SSR circuitry 165. The third inductor 218 receives the supply signal from the FET stack circuitry 135, the clamping circuitry 140, and/or the kick back SSR circuitry 165. The third inductor 218 supplies the supply signal to the second inductor 214 and the second capacitor 216. In some examples, the third inductor 218 represents an inductance of a connector coupling the load 120 to the FET stack circuitry 135, the clamping circuitry 140, and the kick back SSR circuitry 165.

The first transistor 220 has a first terminal coupled to the power source 105, the second resistor 228, and the first diode 236. The first transistor 220 has a second terminal coupled to the second transistor 222, the resistors 228, 230, 250, and the diodes 236, 238. The first transistor 220 has a control terminal coupled to the fifth diode 244 and the sixth resistor 250. The first transistor 220 allows current to flow from the first terminal to the second terminal when enabled (e.g., turned on, conducting). The first transistor 220 prevents current from flowing from the first terminal to the second terminal when disabled (e.g., turned off, non-conducting).

The second transistor 222 has a first terminal coupled to the first transistor 220, the resistors 228, 230, 250, and the diodes 236, 238. The second transistor 222 has a second terminal coupled to the third transistor 224, the resistors 230, 232, 252, the diodes 238, 240, and the first voltage source circuitry 256. The second transistor 222 has a control terminal coupled to the third transistor 224, the seventh resistor 252, and the sixth diode 246. The second transistor 222 allows current to flow from the first terminal to the second terminal when enabled. The second transistor 222 prevents current from flowing from the first terminal to the second terminal when disabled.

The third transistor 224 has a first terminal coupled to the second transistor 222, the resistors 230, 232, 252, the diodes 238, 240, and the first voltage source circuitry 256. The third transistor 224 has a second terminal coupled to the fourth transistor 226, the resistors 232, 234, 254, and the diodes 240, 242. The third transistor 224 has a control terminal coupled to the second transistor 222, the seventh resistor 252, and the sixth diode 246. The third transistor 224 allows current to flow from the second terminal to the first terminal when enabled. The third transistor 224 prevents current from flowing from the second terminal to the first terminal when disabled.

The fourth transistor 226 has a first terminal coupled to the third transistor 224, the resistors 232, 234, 254, and the diodes 240, 242. The fourth transistor 226 has a second terminal coupled to the load 120, the kick back SSR circuitry 165, the fifth resistor 234, and the fourth diode 242. The fourth transistor 226 has a control terminal coupled to the seventh diode 248, and the eighth resistor 254. The fourth transistor 226 allows current to flow from the second terminal to the first terminal when enabled. The fourth transistor 226 prevents current from flowing from the second terminal to the first terminal when disabled.

In the example of FIG. 2A, the transistors 220, 222, 224, 226 are n-channel metal-oxide semiconductor field-effect transistors (MOSFETs). Alternatively, the transistors 220, 222, 224, 226 may be n-channel field-effect transistors (FETs), n-channel insulated-gate bipolar transistors (IGBTs), n-channel junction field effect transistors (JFETs), NPN bipolar junction transistors (BJTs) and/or, with slight modifications, p-type equivalent devices.

The second resistor 228 has a first terminal coupled to the power source 105, the first transistor 220, and the first diode 236. The second resistor 228 has a second terminal coupled to the transistors 220, 222, the resistors 230, 250, and the diodes 236, 238. The second resistor 228 is coupled in parallel with the first transistor 220. The second resistor 228 generates a voltage difference approximately equal to a voltage difference across the first transistor 220.

The third resistor 230 has a first terminal coupled to the transistors 220, 222, the resistors 228, 250, and the diodes 236, 238. The third resistor 230 has a second terminal coupled to the transistors 222, 224, the resistors 232, 252, the diodes 238, 240, and the first voltage source circuitry 256. The third resistor 230 is coupled in parallel with the second transistor 222. The third resistor 230 generates a voltage difference approximately equal to a voltage difference across the second transistor 222.

The fourth resistor 232 has a first terminal coupled to the transistors 222, 224, the resistors 230, 252, the diodes 238, 240, and the first voltage source circuitry 256. The fourth resistor 232 has a second terminal coupled to the transistors 224, 226, the resistors 234, 254, and the diodes 240, 242. The fourth resistor 232 is coupled in parallel with the third transistor 224. The third resistor 230 generates a voltage difference approximately equal to a voltage difference across the third transistor 224.

The fifth resistor 234 has a first terminal coupled to the transistors 224, 226, the resistors 232, 254, and the diodes 240, 242. The fifth resistor 234 has a second terminal coupled to the load 120, the kick back SSR circuitry 165, the fourth transistor 226, and the fourth diode 242. The fifth resistor 234 is coupled in parallel with the fourth transistor

226. The fifth resistor 234 generates a voltage difference approximately equal to a voltage difference across the fourth transistor 226.

In the example of FIG. 2A, the resistors 228, 230, 232, 234 form voltage divider circuitry. The resistors 228, 230, 232, 234 divide a voltage of the supply signal from the power source 105 across the transistors 220, 222, 224, 226. In some examples, the resistors 228, 230, 232, 234 have approximately the same resistance. In such examples, the resistors 228, 230, 232, 234 evenly divide the voltage of the supply signal across the transistors 220, 222, 224, 226.

For example, the resistors 228, 230, or the resistors 232, 234 may have a voltage difference of approximately one-hundred volts when the power source 105 supplies an AC signal with a two-hundred-volt amplitude. In such an example, the resistors 228, 230 have a voltage difference of approximately one-hundred volts each when the amplitude of the AC signal from the power source 105 is positive, while the resistors 232, 234 have a voltage difference approximately equal to the voltage drop across the diodes 240, 242. Also, the resistors 232, 234 have a voltage difference of approximately one-hundred volts each when the amplitude of the AC signal from the power source 105 is negative, while the resistors 228, 230 have a voltage difference approximately equal to the voltage drop across the diodes 236, 238. Advantageously, the resistors 228, 230, 232, 234 distribute the voltage stress of the supply signal from the power source 105 across the transistors 220, 222, 224, 226. Advantageously, balancing the voltage stress across the transistors 220, 222, 224, 226 increases reliability of the transistors 220, 222, 224, 226.

The first diode 236 has a first terminal coupled to the power source 105, the first transistor 220, and the second resistor 228. The first diode 236 has a second terminal coupled to the transistors 220, 222, the resistors 228, 230, 250, and the second diode 238. The first diode 236 is coupled in parallel with the first transistor 220. The first diode 236 allows current to flow from the second terminal to the first terminal when forward biased. The first diode 236 is forward biased when the voltage of the second terminal is greater than the voltage of the first terminal. The first diode 236 prevents current from flowing from the first terminal to the second terminal.

The second diode 238 has a first terminal coupled to the transistors 220, 222, the resistors 228, 230, 250, and the first diode 236. The second diode 238 has a second terminal coupled to the transistors 222, 224, the resistors 230, 232, 252, the third diode 240, and the first voltage source circuitry 256. The second diode 238 is coupled in parallel with the second transistor 222. The second diode 238 allows current to flow from the second terminal to the first terminal when forward biased. The second diode 238 is forward biased when the voltage of the second terminal is greater than the voltage of the first terminal. The second diode 238 prevents current from flowing from the first terminal to the second terminal.

The third diode 240 has a first terminal coupled to the transistors 222, 224, the resistors 230, 232, 252, the second diode 238, and the first voltage source circuitry 256. The third diode 240 has a second terminal coupled to the transistors 224, 226, the resistors 232, 234, 254, and the fourth diode 242. The third diode 240 is coupled in parallel with the third transistor 224. The third diode 240 allows current to flow from the first terminal to the second terminal when forward biased. The third diode 240 is forward biased when the voltage of the first terminal is greater than the voltage of the second terminal. The third diode 240 prevents current from flowing from the second terminal to the first terminal.

The fourth diode 242 has a first terminal coupled to the transistors 224, 226, the resistors 232, 234, 254, and the third diode 240. The fourth diode 242 has a second terminal coupled to the load 120, the kick back SSR circuitry 165, the fourth transistor 226, and the fifth resistor 234. The fourth diode 242 is coupled in parallel with the fourth transistor 226. The fourth diode 242 allows current to flow from the first terminal to the second terminal when forward biased. The fourth diode 242 is forward biased when the voltage of the first terminal is greater than the voltage of the second terminal. The fourth diode 242 prevents current from flowing from the second terminal to the first terminal.

In the example of FIG. 2A, the diodes 236, 238, 240, 242 balance source voltages of the transistors 220, 222, 224, 226 during turn on. During turn on, the first voltage source circuitry 256 directly sets the source voltages of the transistors 222, 224 and forward biases the diodes 236, 238, 240, 242 based on the supply signal. The diodes 236, 238, 240, 242 set the source voltages of the transistors 220, 226 to a voltage based on the source voltages of the transistors 222, 224. In such a configuration, the diodes 236, 238, 240, 242 allow the transistors 220, 226 to begin to turn on, while the transistors 222, 224 are still turning on. Advantageously, using the diodes 236, 238, 240, 242 to ensure the transistors 220, 222, 224, 226 turn on at approximately the same time increases reliability by preventing unbalanced voltages stress from being applied.

In some examples, the diodes 236, 238, 240, 242 are a type of diode capable of breaking down without becoming permanently damaged, such a Schottky diode, Zener diode, etc. In such examples, the diodes 236, 238, 240, 242 break down (e.g., short the transistors 220, 222, 224) responsive to being reversed biased by a voltage greater than a breakdown voltage. For example, the first diode 236 becomes a short responsive to a voltage difference greater than or equal to one-hundred and fifty volts across the first transistor 220, when the breakdown voltage of the first diode 236 is approximately one-hundred and fifty volts. In such an example, the first diode 236 prevents voltages greater than one-hundred and fifty volts from being applied across the first transistor 220. Advantageously, the diodes 236, 238, 240, 242 protect the transistors 220, 222, 224, 226 from excessive voltages.

Although in the example of FIG. 2A, the diodes 236, 238, 240, 242 are illustrated, in some examples, the diodes 236, 238, 240, 242 may be described and/or illustrated as body diodes of the transistors 220, 222, 224, 226. In such examples, the diodes 236, 238, 240, 242 may not be illustrated.

The fifth diode 244 has a first terminal coupled to the gate driver circuitry 160 and the diodes 246, 248. The fifth diode 244 has a second terminal coupled to the first transistor 220 and the sixth resistor 250. The fifth diode 244 allows current to flow from the first terminal to the second terminal when forward biased. The fifth diode 244 is forward biased when the voltage of the first terminal is greater than the voltage of the second terminal. The fifth diode 244 prevents current from flowing from the second terminal to the first terminal. The fifth diode 244 controls the first transistor 220. The fifth diode 244 enables the first transistor 220 by supplying current to the sixth resistor 250. The fifth diode 244 disables the first transistor 220 by not supplying current to the sixth resistor 250.

The sixth diode 246 has a first terminal coupled to the gate driver circuitry 160 and the diodes 244, 248. The sixth diode 246 has a second terminal coupled to the transistors 222, 224 and the seventh resistor 252. The sixth diode 246 allows current to flow from the first terminal to the second terminal when forward biased. The sixth diode 246 is forward biased when the voltage of the first terminal is greater than the voltage of the second terminal. The sixth diode 246 prevents current from flowing from the second terminal to the first terminal. The sixth diode 246 controls the transistors 222, 224. The sixth diode 246 enables the transistors 222, 224 by supplying current to the seventh resistor 252. The sixth diode 246 disables the transistors 222, 224 by not supplying current to the seventh resistor 252.

The seventh diode 248 has a first terminal coupled to the gate driver circuitry 160 and the diodes 244, 246. The seventh diode 248 has a second terminal coupled to the fourth transistor 226 and the eighth resistor 254. The seventh diode 248 allows current to flow from the first terminal to the second terminal when forward biased. The seventh diode 248 is forward biased when the voltage of the first terminal is greater than the voltage of the second terminal. The seventh diode 248 prevents current from flowing from the second terminal to the first terminal. The seventh diode 248 controls the fourth transistor 226. The seventh diode 248 enables the fourth transistor 226 by supplying current to the eighth resistor 254. The seventh diode 248 disables the fourth transistor 226 by not supplying current to the eighth resistor 254.

The sixth resistor 250 has a first terminal coupled to the first transistor 220 and the fifth diode 244. The sixth resistor 250 has a second terminal coupled to the transistors 220, 222, the resistors 228, 230, and the diodes 236, 238. The sixth resistor 250 generates a voltage difference between the first terminal and the second terminal responsive to a current from the fifth diode 244. The voltage difference of the sixth resistor 250 is configured to be greater than or equal to the threshold of the first transistor 220. In such a configuration, the sixth resistor 250 enables the first transistor 220 responsive to a current from the fifth diode 244. The sixth resistor 250 is configured to pull down the voltage of the first terminal to be approximately equal to the voltage of the second terminal when the fifth diode 244 does not supply current. In such a configuration, the sixth resistor 250 disables the first transistor 220 responsive to no current from the fifth diode 244.

The seventh resistor 252 has a first terminal coupled to the transistors 222, 224 and the sixth diode 246. The seventh resistor 252 has a second terminal coupled to the transistors 222, 224, the resistors 230, 232, and the diodes 238, 240. The seventh resistor 252 generates a voltage difference between the first terminal and the second terminal responsive to a current from the sixth diode 246. The voltage difference of the seventh resistor 252 is configured to be greater than or equal to the threshold of the transistors 222, 224. In such a configuration, the seventh resistor 252 enables the transistors 222, 224 responsive to a current from the sixth diode 246. The seventh resistor 252 is configured to pull down the voltage of the first terminal to be approximately equal to the voltage of the second terminal when the sixth diode 246 does not supply current. In such a configuration, the seventh resistor 252 disables the transistors 222, 224 responsive to no current from the sixth diode 246.

The eighth resistor 254 has a first terminal coupled to the fourth transistor 226 and the seventh diode 248. The eighth resistor 254 has a second terminal coupled to the transistors 224, 226, the resistors 232, 234, and the diodes 240, 242.

The eighth resistor 254 generates a voltage difference between the first terminal and the second terminal responsive to a current from the seventh diode 248. The voltage difference of the eighth resistor 254 is configured to be greater than or equal to the threshold of the fourth transistor 226. In such a configuration, the eighth resistor 254 enables the fourth transistor 226 responsive to a current from the seventh diode 248. The eighth resistor 254 is configured to pull down the voltage of the first terminal to be approximately equal to the voltage of the second terminal when the seventh diode 248 does not supply current. In such a configuration, the eighth resistor 254 disables the fourth transistor 226 responsive to no current from the seventh diode 248.

In the example of FIG. 2A, the diodes 244, 246, 248 and the resistors 250, 252, 254 allow the transistors 220, 222, 224, 226 to be controlled by a single instance of the gate driver circuitry 160. The resistors 250, 252, 254 allow currents from the diodes 244, 246, 248 to generate voltage differences in reference to the individual source terminals of the transistors 220, 222, 224, 226. Advantageously, the diodes 244, 246, 248 and the resistors 250, 252, 254 reduce the number of instances of the gate driver circuitry 160 needed to control the transistors 220, 222, 224, 226.

Although in the example of FIG. 2A, the FET stack circuitry 135 includes the transistors 220, 222, 224, 226, the circuitries 135, 140, 150, 155 may be modified to include one or more additional transistors. For example, the FET stack circuitry 135 may include six transistors, the clamping circuitry 140 may include six diodes, the gate diode circuitry 150 may include five diodes, and the pull-down circuitry 155 may include five resistors. In such an example, the additional circuitry is coupled to the transistors 220, 226, the resistors 228, 234, and the diodes 236, 242. Advantageously, additional the circuitries 135, 140, 150, 155 may be modified distribute a supply voltage across a plurality of transistors. In some examples, the number of transistors may be increased for a given supply voltage to allow the transistors to be relatively lower voltage transistors. For example, a three-hundred-volt AC supply signal may be divided across six one-hundred-volt transistors or twelve fifty-volt transistors.

Figure 3:
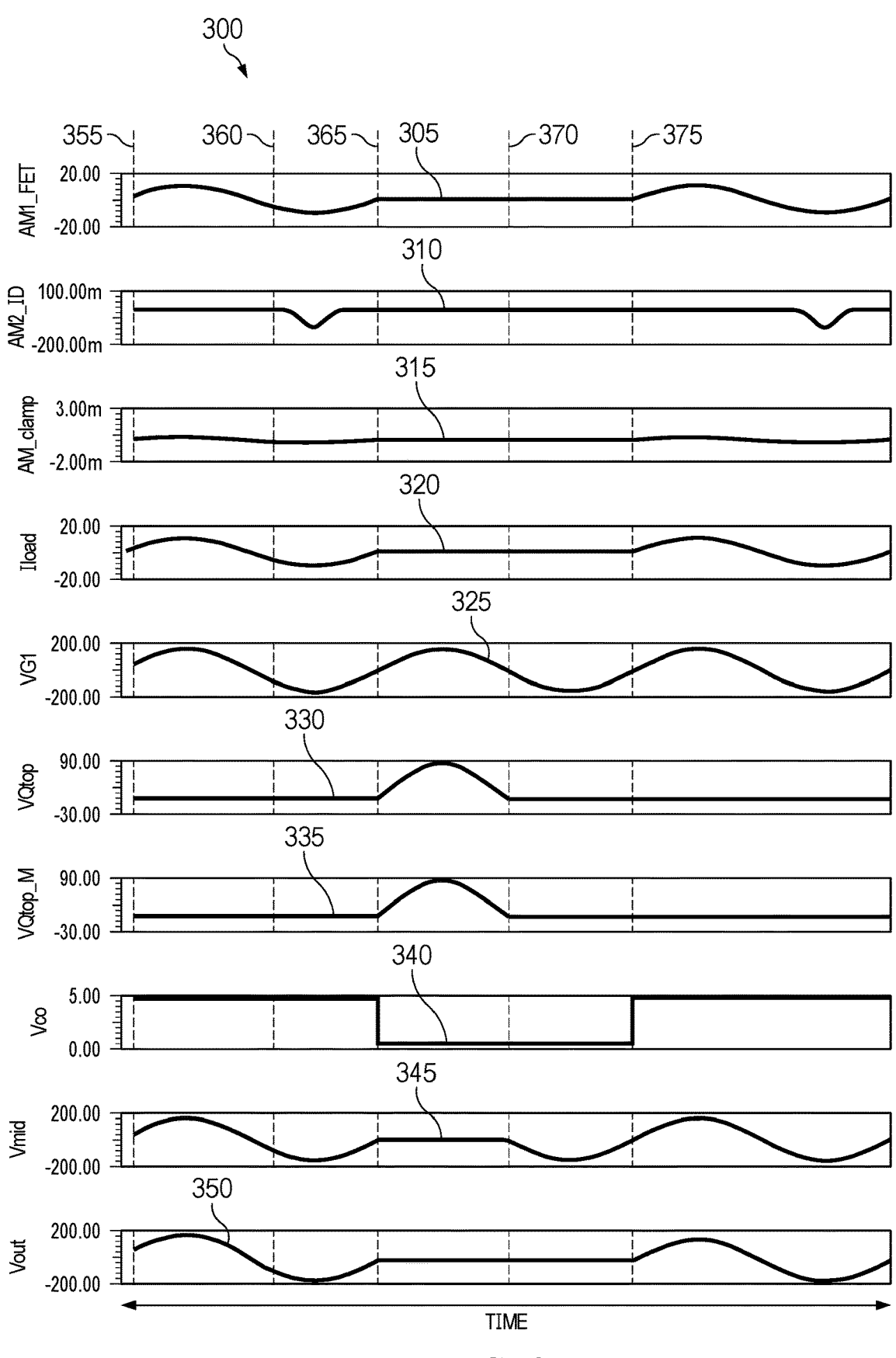
FIG. 3 is an example timing diagram showing signal plots of signals during operation of the example power supply system of FIGS. 1 and 2 when the power source is an alternating current (AC) source.
Figure 4:
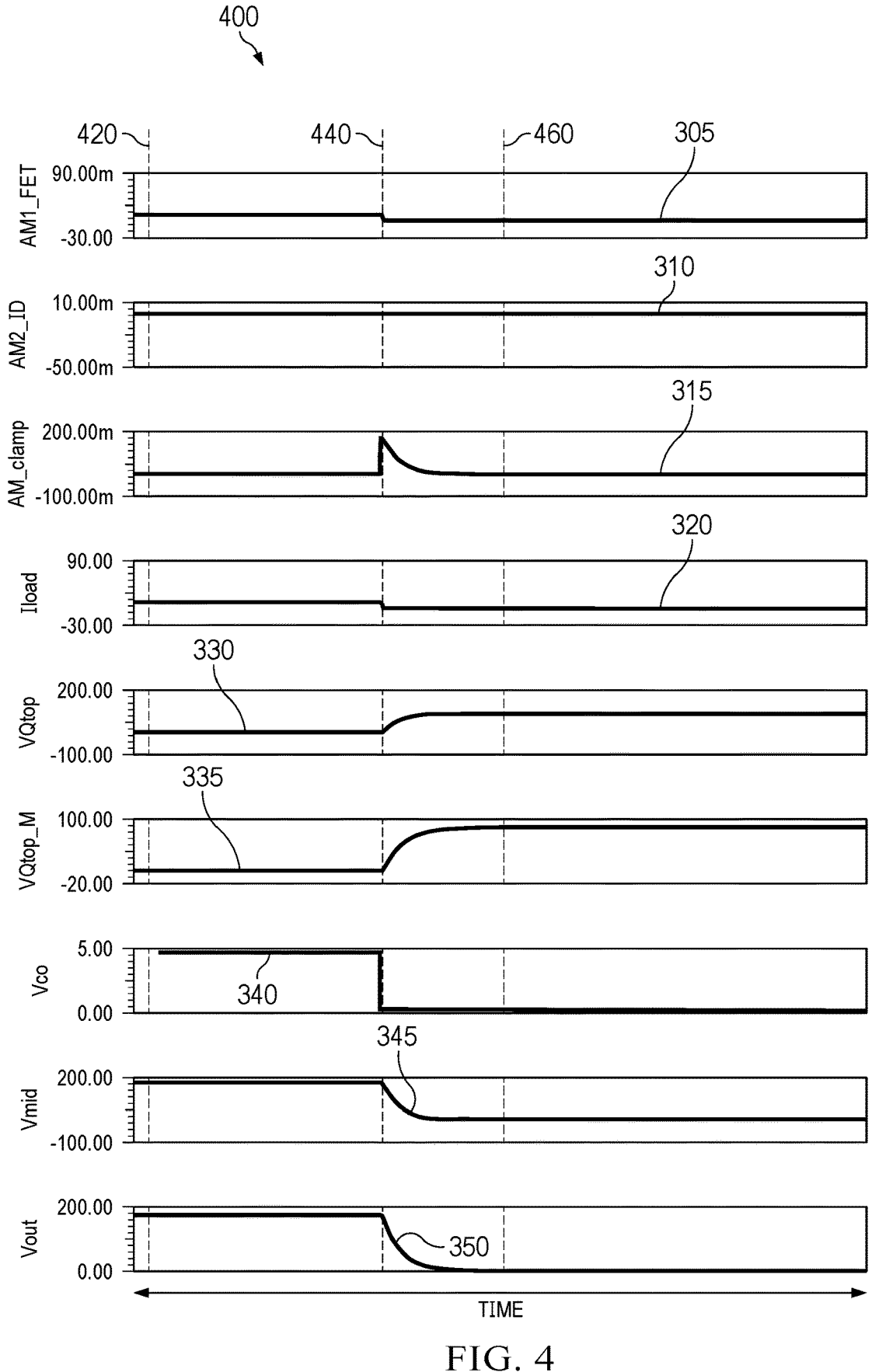
FIG. 4 is an example timing diagram showing signal plots of signal during an example hard turn off operation of the example power supply system of FIGS. 1 and 2 when the power source is a direct current (DC) source.
Figure 5:
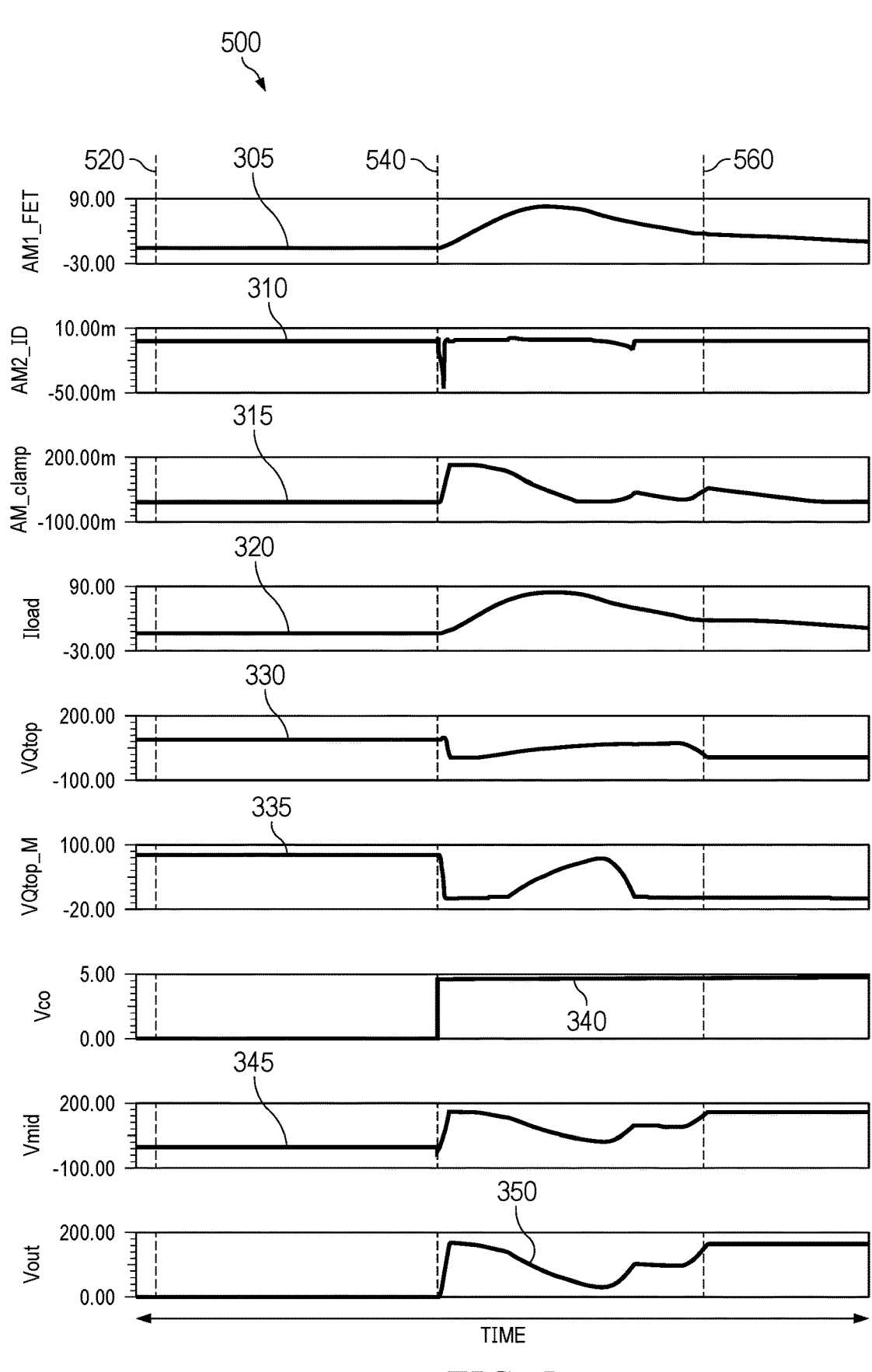
FIG. 5 is an example timing diagram showing signal plots of signals during an example hard turn on operation of the example power supply system of FIGS. 1 and 2 when the power source is a DC source and the load has an inductive component.

The first voltage source circuitry 256 has a first terminal coupled to the transistors 222, 224, the resistors 230, 232, and the diodes 238, 240. The first voltage source circuitry 256 has a second terminal coupled to the ninth resistor 258. The first voltage source circuitry 256 generates a voltage difference between the first terminal and the second terminal. The voltage of the first terminal of the first voltage source circuitry 256 may refer to the middle voltage (VMID). The middle voltage is approximately equal to the voltage of the supply signal minus the voltage drops across the transistors 220, 222. The middle voltage during example operations is illustrated in FIGS. 3, 4, 5, below. The first voltage source circuitry 256 supplies a reference voltage to the ninth resistor 258 based on the middle voltage. For example, the first voltage source circuitry 256 supplies a reference voltage approximately ten volts greater than middle voltage when the first voltage source circuitry 256 generates a ten-volt difference. Advantageously, the ninth resistor 258 receives a voltage greater than the middle voltage.

The ninth resistor 258 has a first terminal coupled to the first voltage source circuitry 256. The ninth resistor 258 has a second terminal coupled to the second switch 260. The ninth resistor 258 generates a voltage difference based on a current flowing through the ninth resistor 258.

The second switch 260 has a first terminal coupled to the ninth resistor 258. The second switch 260 has a second terminal coupled to the diodes 244, 246, 248 of the gate diode circuitry 150. The second switch 260 has a control terminal coupled to the first switch control circuitry 262. The second switch 260 forward biases the diodes 244, 246, 248 responsive to being closed (e.g., conducting). In such a configuration, the second switch 260 couples the ninth resistor 258 to the diodes 244, 246, 248. The second switch 260 prevents the diodes 244, 246, 248 from being forward biased responsive to being opened (e.g., non-conducting). In such a configuration, the second switch 260 prevents the ninth resistor 258 from supplying current to the diodes 244, 246, 248. Advantageously, closing the second switch 260 enables the transistors 220, 222, 224, 226, while opening the second switch 260 disables the transistors 220, 222, 224, 226.

The first switch control circuitry 262 has a first terminal coupled to the tenth resistor 264 and the third switch 266. The first switch control circuitry 262 has a second terminal coupled to the common terminal that supplies the common potential. The first switch control circuitry 262 has a controlling terminal coupled to the second switch 260. The first switch control circuitry 262 controls the second switch 260 based on the voltage coupled to the first terminal of the first switch control circuitry 262. In some examples, the first switch control circuitry 262 closes the second switch 260 when the first terminal of the first switch control circuitry 262 is coupled to a voltage greater than or equal to a threshold voltage. In such examples, the first switch control circuitry 262 opens the second switch 260 when the first terminal of the first switch control circuitry 262 is coupled to a voltage less than the threshold voltage. Advantageously, the first switch control circuitry 262 isolates voltages of the circuitries 135, 140, 150, 155 from voltages of the gate driver circuitry 160. Advantageously, a relatively lower voltage signal may be used by the first switch control circuitry 262 to control relatively higher voltages of the circuitries 135, 140, 150, 155.

The tenth resistor 264 has a first terminal coupled to the first switch control circuitry 262 and the third switch 266. The tenth resistor 264 has a second terminal coupled to the common terminal that supplies the common potential. The tenth resistor 264 generates a reference voltage responsive to a current from the third switch 266. The tenth resistor 264 supplies the reference voltage to the first switch control circuitry 262. The tenth resistor 264 pulls down the voltage of the first switch control circuitry 262 to approximately the common potential responsive to no current from the third switch 266.

The third switch 266 has a first terminal coupled to the first switch control circuitry 262 and the tenth resistor 264. The third switch 266 has a second terminal coupled to the second voltage source circuitry 268. The third switch 266 has a control terminal adaptive to be coupled to external circuitry. In the example of FIG. 1, the control terminal of the third switch 266 is coupled to the load 120. In such examples, the load 120 is configured to control the gate driver circuitry 160. The third switch 266 couples the first switch control circuitry 262 and the tenth resistor 264 to the second voltage source circuitry 268 when closed. In such a configuration, the reference voltage of the tenth resistor 264 is approximately equal to the voltage of the second voltage source circuitry 268. The third switch 266 prevents the tenth resistor 264 from generating the reference voltage when opened. In such a configuration, the reference voltage of the tenth resistor 264 is approximately equal to the common potential. Advantageously, closing the third switch 266 enables the transistors 220, 222, 224, 226, while opening the third switch 266 disables the transistors 220, 222, 224, 226.

The second voltage source circuitry 268 has a first terminal coupled to the third switch 266. The second voltage source circuitry 268 has a second terminal coupled to the common terminal that supplies the common potential. The second voltage source circuitry 268 generates a voltage difference. The second voltage source circuitry 268 supplies the voltage difference to the third switch 266. The voltage difference of the second voltage source circuitry 268 is configured to be greater than the threshold voltage of the first switch control circuitry 262.

The eleventh resistor 270 has a first terminal coupled to the load 120, the FET stack circuitry 135, the clamping circuitry 140, and the thirteenth resistor 288. The eleventh resistor 270 has a second terminal coupled to the fifth transistor 272. The eleventh resistor 270 generates a voltage difference responsive to the fifth transistor 272 sourcing a current from the eleventh resistor 270.

The fifth transistor 272 has a first terminal coupled to the eleventh resistor 270. The fifth transistor 272 has a second terminal coupled to the twelfth resistor 274, the sixth transistor 276, and the third voltage source circuitry 278. The fifth transistor 272 has a control terminal coupled to the twelfth resistor 274, the sixth transistor 276, and the fourth switch 280. The fifth transistor 272 allows current to flow from the first terminal to the second terminal when enabled. The fifth transistor 272 prevents current from flowing from the first terminal to the second terminal when disabled.

The twelfth resistor 274 has a first terminal coupled to the transistors 272, 276 and the third voltage source circuitry 278. The twelfth resistor 274 has a second terminal coupled to the transistors 272, 276 and the fourth switch 280. The twelfth resistor 274 generates a voltage difference between the first terminal and the second terminal responsive to a current from the fourth switch 280. The voltage difference of the twelfth resistor 274 is configured to be greater than or equal to the threshold of the transistors 272, 276. In such a configuration, the twelfth resistor 274 enables the transistors 272, 276 responsive to a current from the fourth switch 280. The twelfth resistor 274 is configured to pull down the voltage of the first terminal to be approximately equal to the voltage of the second terminal when the fourth switch 280 does not supply current. In such a configuration, the twelfth resistor 274 disables the transistors 272, 276 responsive to no current from the fourth switch 280.

The sixth transistor 276 has a first terminal coupled to the fifth transistor 272, the twelfth resistor 274, and the third voltage source circuitry 278. The sixth transistor 276 has a second terminal coupled to the common terminal that supplies the common potential. The sixth transistor 276 has a control terminal coupled to the fifth transistor 272, the twelfth resistor 274, and the fourth switch 280. The sixth transistor 276 allows current to flow from the first terminal to the second terminal when enabled. The sixth transistor 276 prevents current from flowing from the first terminal to the second terminal when disabled.

The third voltage source circuitry 278 has a first terminal coupled to the transistors 272, 276 and the twelfth resistor 274. The third voltage source circuitry 278 has a second terminal coupled to the fourth switch 280. The third voltage source circuitry 278 generates a voltage difference between the first terminal and the second terminal. The third voltage source circuitry 278 supplies a reference voltage to the fourth switch 280 based on the voltage of the first terminal of the third voltage source circuitry 278.

The fourth switch 280 has a first terminal coupled to the transistors 272, 276 and the twelfth resistor 274. The fourth switch 280 has a second terminal coupled to the third voltage source circuitry 278. The fourth switch 280 has a control terminal coupled to the second switch control circuitry 282. The fourth switch 280 couples the third voltage source circuitry 278 to the transistors 272, 276 and the twelfth resistor 274 responsive to being closed (e.g., conducting). The fourth switch 280 prevents the third voltage source circuitry 278 from enabling the transistors 272, 276 responsive to being opened (e.g., non-conducting).

The second switch control circuitry 282 has a first terminal coupled to fifth switch 284. The second switch control circuitry 282 has a second terminal coupled to the common terminal that supplies the common potential. The second switch control circuitry 282 has a controlling terminal coupled to the fourth switch 280. The second switch control circuitry 282 controls the fourth switch 280 based on the voltage coupled to the first terminal of the second switch control circuitry 282. In some examples, the second switch control circuitry 282 closes the fourth switch 280 when the first terminal of the second switch control circuitry 282 is coupled to a voltage greater than or equal to a threshold voltage. In such examples, the second switch control circuitry 282 opens the fourth switch 280 when the first terminal of the second switch control circuitry 282 is coupled to a voltage less than the threshold voltage.

The fifth switch 284 a first terminal coupled to the second switch control circuitry 282. The fifth switch 284 has a second terminal coupled to the fourth voltage source circuitry 286. The fifth switch 284 has a control terminal adaptive to be coupled to external circuitry, similar to the third switch 266 of the gate driver circuitry 160.

The fifth switch 284 couples the second switch control circuitry 282 to the fourth voltage source circuitry 286 when closed. The fifth switch 284 prevents the second switch control circuitry 282 from closing the fourth switch 280 when opened.

The fourth voltage source circuitry 286 has a first terminal coupled to the fifth switch 284. The fourth voltage source circuitry 286 has a second terminal coupled to the common terminal that supplies the common potential. The fourth voltage source circuitry 286 generates a voltage difference. The fourth voltage source circuitry 286 supplies the voltage difference to the fifth switch 284. The voltage difference of the fourth voltage source circuitry 286 is configured to be greater than the threshold voltage of the second switch control circuitry 282. In some examples, the fifth switch 284 and the fourth voltage source circuitry 286 are shared with gate driver circuitry 160. In such examples, the third switch 266 is coupled to the second switch control circuitry 282.

The thirteenth resistor 288 has a first terminal coupled to the load 120, the FET stack circuitry 135, the clamping circuitry 140, and the eleventh resistor 270. The thirteenth resistor 288 has a second terminal coupled to the third capacitor 290. The thirteenth resistor 288 generates a voltage difference responsive to a current.

The third capacitor 290 has a first terminal coupled to the thirteenth resistor 288. The third capacitor 290 has a second terminal coupled to the common terminal that supplies the common potential. The thirteenth resistor 288 charges the third capacitor 290. The third capacitor 290 supplies a current to the thirteenth resistor 288 while discharging. The third capacitor 290 supplies a current to the load 120 and/or the eleventh resistor 270 to compensate for relatively sudden changes in a current being supplied to the load 120. Advantageously, discharging the third capacitor 290 prevents inductive components of the load 120 (e.g., the inductors 214, 218) from generating a relatively large negative voltage.

FIG. 3 is an example timing diagram 300 of an example operation of the example power supply system 100 of FIGS. 1 and 2 when the power source 105 of FIGS. 1 and 2 is an example an AC source. In the example of FIG. 3, the timing diagram 300 illustrates an example FET stack current (AM1_FET) 305, an example clamping diode current (AM2_ID) 310, an example kick back current (AM_CLAMP) 315, an example load current (Iload) 320, an example AC supply signal (VG1) 325, an example first transistor voltage (VQtop) 330, an example second transistor voltage (VQtop_M) 335, an example gate driver control (Vco) 340, an example middle voltage (Vmid) 345, and an example output voltage (Vout) 350 over time.

The FET stack current 305 represents the current flowing through the transistors 220, 222, 224, 226 of FIG. 2A of the FET stack circuitry 135 of FIGS. 1 and 2. The clamping diode current 310 represents the current flowing through the diodes 236, 238, 240, 242 of FIG. 2A of the clamping circuitry 140 of FIGS. 1 and 2. The kick back current 315 represents the current flowing through the transistors 272, 276 of FIG. 2A of the kick back SSR circuitry 165 of FIGS. 1 and 2. The load current 320 represents the current being supplied to the load 120 of FIGS. 1 and 2. The AC supply signal 325 represents the voltage of the supply signal from the first supply circuitry 202 of FIG. 2B of the power source 105 of FIGS. 1 and 2. The first transistor voltage 330 represents the voltage difference across the first transistor 220 of the FET stack circuitry 135. The second transistor voltage 335 represents the voltage difference across the second transistor 222 of the FET stack circuitry 135. The gate driver control 340 represents the control of the third switch 266 of FIG. 2A of the gate driver circuitry 160 of FIGS. 1 and 2. The middle voltage 345 represents the voltage between the transistors 222, 224 of the FET stack circuitry 135. The output voltage 350 represents the voltage supplied to the load 120.

At a first time 355, the first switch 206 of FIG. 2B is coupled to the first supply circuitry 202. In such a configuration, the power source 105 is configured to supply the AC supply signal 325 to the FET stack circuitry 135 and the clamping circuitry 140. At the first time 355, the gate driver circuitry 160 supplies a current to the diodes 244, 246, 248 of the gate diode circuitry 150 of FIGS. 1 and 2 responsive to the gate driver control 340. At the first time 355, the gate driver control 340 closes the third switch 266, which causes the first switch control circuitry 262 of FIG. 2A to close the second switch 260 of FIG. 2A.

At a second time 360, the clamping diode current 310 decreases as a negative amplitude of the AC supply signal 325 begins to increase. At approximately the second time 360, the voltage of the AC supply signal 325 continues to decrease below the common potential. At such a time, the power source 105 sinks a current responsive to the negative voltages of the AC supply signal 325 forward biasing the diodes 236, 238. The decrease of the clamping diode current 310 is proportional to the amplitude of the AC supply signal 325.

At a third time 365, the gate driver control 340 transitions to a logical low, which opens the third switch 266 and disables the gate driver circuitry 160. Beginning at approximately the third time 365, the FET stack current 305, the load current 320, the middle voltage 345, and the output voltage 350 remain fixed responsive to the gate driver circuitry 160 disabling the transistors 220, 222, 224, 226. At such a time, the resistors 250, 252, 254 of FIG. 2A of the pull-down circuitry 155 of FIGS. 1 and 2A pull down the gate voltages of the transistors 220, 222, 224, 226 to be approximately equal to the source voltages of the transistors 220, 222, 224, 226.

The third time 365 occurs at approximately a zero crossing of the AC supply signal 325. Such a switching may be referred to as zero-voltage switching (ZVS). Advantageously, switching the transistors 220, 222, 224, 226 at a zero crossing of the AC supply signal 325 reduces a likelihood of exposing the transistors 220, 222, 224, 226 to excessive voltages. Advantageously, implementing ZVS, when the power source 105 is an AC source, increases reliability of the FET stack circuitry 135.

Beginning at the third time 365, the transistor voltages 330, 335 transition from fixed values to voltages resembling the AC supply signal 325. Such an operation of the transistor voltages 330, 335 is responsive to the AC supply signal 325 reverse biasing the diodes 236, 238 of the clamping circuitry 140 and forward biasing the diodes 240, 242 of FIG. 2A of the clamping circuitry 140. At the third time 365, the transistor voltages 330, 335 are approximately equal responsive to the resistors 228, 230 of FIG. 2A of the FET stack circuitry 135 dividing the voltage of the AC supply signal 325.

At a fourth time 370 the transistor voltage 330, 335 remain at a fixed voltage responsive to the AC supply signal 325 forward biasing the diodes 236, 238 and reverse biasing the diodes 240, 242. At the fourth time 370, the middle voltage 345 resembles the AC supply signal 325 responsive to the diodes 236, 238 being forward biased.

At a fifth time 375, the AC supply signal 325 has a zero-crossing and the gate driver control 340 enables the gate driver circuitry 160. Following the fifth time 375, the AC supply signal 325 is supplied to the load 120 responsive to the transistors 220, 222, 224, 226 being enabled.

FIG. 4 is an example timing diagram 400 of an example hard turn off operation of the example power supply system 100 of FIGS. 1 and 2 when the power source 105 of FIGS. 1 and 2 is an example DC source. In the example of FIG. 4, the timing diagram 400 illustrates the FET stack current 305 of FIG. 3, the clamping diode current 310 of FIG. 3, the kick back current 315 of FIG. 3, the load current 320 of FIG. 3, the first transistor voltage 330 of FIG. 3, the second transistor voltage 335 of FIG. 3, the gate driver control 340 of FIG. 3, the middle voltage 345 of FIG. 3, and the output voltage 350 of FIG. 3 over time. An example hard turn off operation is a process of controlling the gate driver circuitry of FIGS. 1 and 2 to disconnect the supply of power, while power is being supplied.

At a first time 420, the gate driver circuitry 160 enables the transistors 220, 222, 224, 226 of FIG. 2A responsive to the gate driver control 340 being a logical high. At the first time 420, the transistor voltages 330, 335 are approximately equal responsive to the voltage division by the resistors 228, 230 of FIG. 2A. At the first time 420, the middle voltage 345 is approximately equal to the output voltage 350 responsive to the DC supply reverse biasing the diodes 236, 238 of FIG. 2A and forward biasing the diodes 240, 242 of FIG. 2A.

At a second time 440, the gate driver circuitry 160 disables the transistors 220, 222, 224, 226 responsive to the gate driver control 340 transitioning to a logical low. At the second time 440, the FET stack current 305 responds to disabling the transistors 220, 222, 224, 226. At the second time 440, the kick back current 315 increases as inductive components (e.g., the inductors 214, 218 of FIG. 2A) of the load 120 of FIGS. 1 and 2 resist the sudden change in the load current 320. At the second time 440, the kick back SSR circuitry 165 of FIGS. 1 and 2 sinks the kick back current 315. Advantageously, the kick back SSR circuitry 165 prevents the kick back current 315 from generating a relatively high negative voltage at the output voltage 350.

At a third time 460, the transistors 220, 222, 224, 226 remain disabled. At the third time 460, the kick back current 315 has settled. Between the times 440 and 460, the transistor voltages 330, 335, the middle voltage 345, and the output voltage 350 have settled to steady state values. Beginning at the third time 460, the load 120 has adjusted to the transition at the second time 440.

FIG. 5 is an example timing diagram 500 of an example hard turn on operation of the example power supply system 100 of FIGS. 1 and 2 when the power source 105 of FIGS. 1 and 2 is an example DC source and the load 120 of FIGS. 1 and 2 has an inductive component (e.g., the inductors 214, 218 of FIG. 2B). In the example of FIG. 5, the timing diagram 500 illustrates the FET stack current 305 of FIGS. 3 and 4, the clamping diode current 310 of FIGS. 3 and 4, the kick back current 315 of FIGS. 3 and 4, the load current 320 of FIGS. 3 and 4, the first transistor voltage 330 of FIGS. 3 and 4, the second transistor voltage 335 of FIGS. 3 and 4, the gate driver control 340 of FIGS. 3 and 4, the middle voltage 345 of FIGS. 3 and 4, and the output voltage 350 of FIGS. 3 and 4 over time.

At a first time 520, the gate driver circuitry 160 of FIGS. 1 and 2 is disabled and the transistors 220, 222, 224, 226 of FIG. 2A are disabled. The first time 520 of FIG. 5 may occur after the third time 460 of FIG. 4.

At a second time 540, the gate driver circuitry 160 enables the transistors 220, 222, 224, 226 responsive to the gate driver control 340 transitioning to a logical high. Beginning at the second time 540 the FET stack current 305 begins to increase as the transistors 220, 222, 224, 226 begin to source current from the power source 105. At the second time 540, the load current 320 remains approximately equal to the FET stack current 305. At the second time 540, the clamping diode current 310 rapidly decreases as the diodes 240, 242 of FIG. 2A are forward biased by the transistors 222, 224 turning on before the transistors 220, 226. At the second time 540, the diodes 236, 238 of FIG. 2A are initially reverse biased. The rapid change in the clamping diode current 310 corrects the uneven turning on of the transistors 220, 222, 224, 226 by balancing source voltages. Advantageously, by ensuring the transistors 220, 222 turn on at approximately the same time, the diodes 236, 238, 240, 242 prevent the first transistor voltage 330 from increasing.

At the second time 540, the inductive components of the load 120 resist the sudden supply of current from the power source 105. At times following the second time 540, the kick back current 315, the middle voltage 345, and the output voltage 350 vary as the inductive components of the load 120 begin to settle.

At a third time 560, the inductive component of the load 120 has adjusted for the attempt to change the load current 320 at the second time 540. At the third time 560, the FET stack current 305, the clamping diode current 310, the kick back current 315, the load current 320, the first transistor voltage 330, the second transistor voltage 335, the middle voltage 345, and the output voltage 350 have approximately settled to steady state values. Following the third time 560, the power source 105 accurately supplies power to the load 120.

Figure 6:
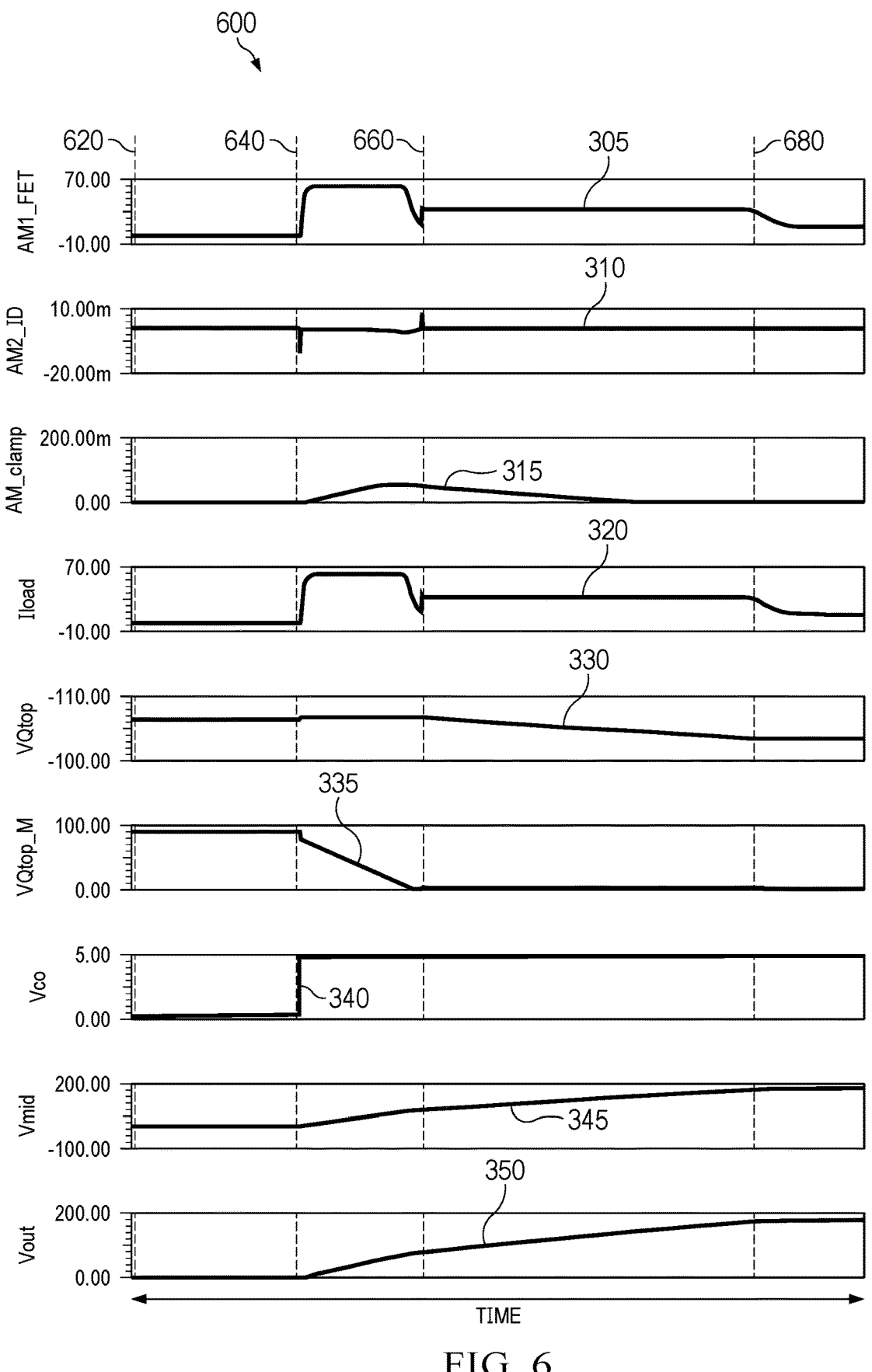
FIG. 6 is an example timing diagram showing signal plots of signal during an example hard turn on operation of the example power supply system of FIGS. 1 and 2 when the power source is a DC source and the load does not have an inductive component.

FIG. 6 is an example timing diagram 600 of an example hard turn on operation of the example power supply system 100 of FIGS. 1 and 2 when the power source 105 of FIGS. 1 and 2 is an example DC source and the load 120 of FIGS. 1 and 2 does not have an inductive component. In the example of FIG. 6, the timing diagram 600 illustrates the FET stack current 305 of FIGS. 3, 4, and 5, the clamping diode current 310 of FIGS. 3, 4, and 5, the kick back current 315 of FIGS. 3, 4, and 5, the load current 320 of FIGS. 3, 4, and 5, the first transistor voltage 330 of FIGS. 3, 4, and 5, the second transistor voltage 335 of FIGS. 3, 4, and 5, the gate driver control 340 of FIGS. 3, 4, and 5, the middle voltage 345 of FIGS. 3, 4, and 5, and the output voltage 350 of FIGS. 3, 4, and 5 over time.

At a first time 620, the gate driver circuitry 160 of FIGS. 1 and 2 is disabled and the transistors 220, 222, 224, 226 of FIG. 2A are disabled. The first time 620 of FIG. 6 may occur after the third time 460 of FIG. 4.

At a second time 640, the gate driver circuitry 160 enables the transistors 220, 222, 224, 226 responsive to the gate driver control 340 transitioning to a logical high. Beginning at the second time 640 the FET stack current 305 begins to increase as the transistors 220, 222, 224, 226 begin to source current from the power source 105. At the second time 640, the load current 320 remains approximately equal to the FET stack current 305. At the second time 640, the clamping diode current 310 rapidly decreases as the diodes 240, 242 of FIG. 2A are forward biased and the diodes 236, 238 of FIG. 2A are reverse biased. At the second time 640, the diodes 240, 242 are biased by the by the transistors 222, 224 turning on before the transistors 220, 226. The rapid change in the clamping diode current 310 corrects the uneven turning on of the transistors 220, 222, 224, 226 by balancing source voltages. Advantageously, by ensuring the transistors 220, 222 turn on at the same time, the diodes 236, 238, 240, 242 prevent the first transistor voltage 330 from increasing.

At a third time 660, the FET stack current 305 and the load current 320 stabilize responsive to the transistors 220, 222, 224, 226 being fully enabled. At the third time 660, the second transistor voltage 335 has settled responsive to the turn on operation of the second time 640. Following the third time 660, the middle voltage 345 and the output voltage 350 continue to increase until a fourth time 680. At approximately the fourth time 680, the middle voltage 345 and the output voltage 350 have settled from the turn on operations at the second time 640.

Figure 7:
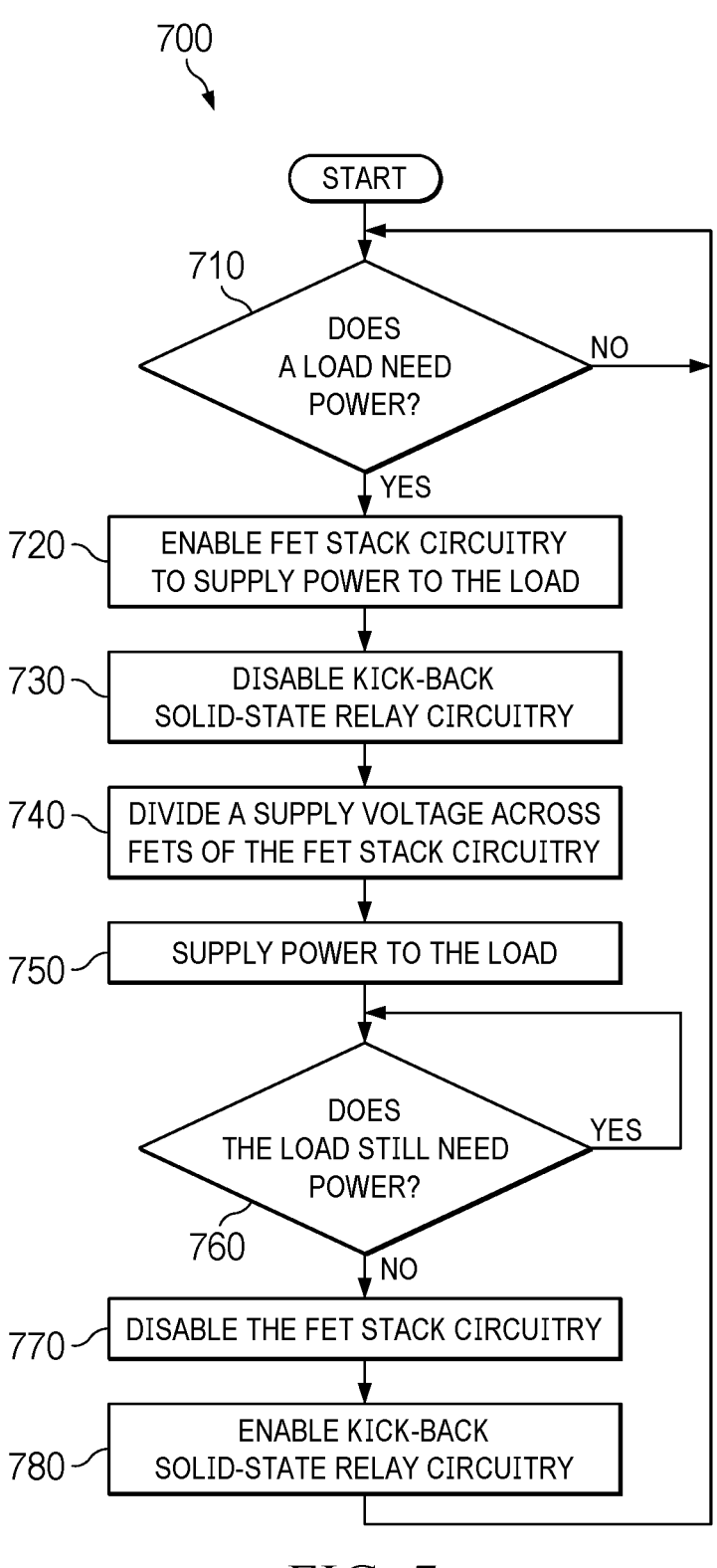
FIG. 7 is a flowchart representative of example operations that may be executed, instantiated, and/or performed by the power switch circuitry of FIGS. 1 and 2.

FIG. 7 is a flowchart representative of example operations 700 that may be executed, instantiated, and/or performed by the power supply system 100 of FIGS. 1 and 2.

The example operations 700 of FIG. 7 begin at block 710, at which the gate driver circuitry 160 determines if a load needs power. In some examples, the gate driver circuitry 160 receives an input from external circuitry, such as the load 120 of FIGS. 1 and 2, indicating whether or not to supply power to the load 120. In some such examples, the input controls the third switch 266 of FIG. 2A. If the gate driver circuitry 160 determines the load does not need power (e.g., Block 710 returns a result of No), control proceeds to return to Block 710.

If the gate driver circuitry 160 determines the load does need power (e.g., Block 710 returns a result of Yes), the gate driver circuitry 160 enables FET stack circuitry to supply power to the load. (Block 720). In some examples, the gate driver circuitry 160 supplies a current to the gate diode circuitry 150 of FIGS. 1 and 2 to forward bias the diodes 244, 246, 248 of FIG. 2A. In such examples, the diodes 244, 246, 248 supply the current to the resistors 250, 252, 254 of FIG. 2A of the pull-down circuitry 155 to generate gate-to-source voltages that enable the transistors 220, 222, 224, 226. Once enabled, the transistors 220, 222, 224, 226 allow the power source 105 to supply power to the load 120. Control proceeds to Block 730.

The fifth switch 284 of FIG. 2B disables the kick back SSR circuitry 165 of FIGS. 1 and 2. (Block 730). In such examples, the second switch control circuitry 282 of FIG. 2B opens the fourth switch 280 of FIG. 2B responsive to opening the fifth switch 284. In such examples, opening the fourth switch 280 disables the kick back SSR circuitry 165. Control proceeds to Block 740.

The FET stack circuitry 135 divides a supply voltage across FETs of the FET stack circuitry 135. (Block 740). In some examples, the transistors 220, 222, 224, 226 divide the voltage of the supply signal from the power source 105. In some such examples the resistors 228, 230, 232, 234 of FIG. 2A create voltage divider circuitry that ensures the supply voltage from the power source 105 is divided across the transistors 220, 222, 224, 226. Control proceeds to Block 750.

The FET stack circuitry 135 supplies power to the load. (Block 750). In some examples, the transistors 220, 222, 224, 226 allow the power source 105 to supply power to the load. In such examples, voltages from the power source 105 may forward bias the diodes 236, 238 of FIG. 2A or the diodes 240, 242 of FIG. 2A and allow current to traverse one or more of the transistors 220, 222, 224, 226. For example, negative amplitudes of an AC signal forward biases the diodes 236, 238, while the diodes 240, 242 are reverse biased. In such an example, the power source 105 may source currents from the transistors 224, 226 by the diodes 236, 238. Control proceeds to Block 760.

The gate driver circuitry 160 determines whether the load still needs power. (Block 760). In some examples, the third switch 266 is coupled to external circuitry to control an output of the gate driver circuitry 160. In such examples, a relatively lower voltage signal may be used to control the third switch 266 responsive to the gate driver circuitry 160 being an isolated gate driver. If the gate driver circuitry 160 determines that the load still needs power (e.g., Block 760 returns a result of Yes), control proceeds to return to Block 760.

If the gate driver circuitry 160 determines that the load no longer needs power (e.g., Block 760 returns a result of No), the gate driver circuitry 160 disables the FET stack circuitry 135. (Block 770). In some examples, the resistors 250, 252, 254 no longer receive a current from the diodes 244, 246, 248. In such examples, the resistors 250, 252, 254 disable the transistors 220, 222, 224, 226 by pulling down the gate-to-source voltages of the transistors 220, 222, 224, 226. Advantageously, the resistors 250, 252, 254 may have resistances capable that pull-down the transistors 220, 222, 224, 226 at approximately the same time constant.

The fifth switch 284 enables the kick back SSR circuitry 165. (Block 780). In such examples, the second switch control circuitry 282 closes the fourth switch 280 responsive to closing the fifth switch 284. In such examples, closing the fourth switch 280 disables the kick back SSR circuitry 165. Control proceeds to return to Block 710.

Although example methods are described with reference to the flowchart illustrated in FIG. 7, many other methods of implementing the power supply system 100 may alternatively be used in accordance with this description. For example, the order of execution of the blocks may be changed, and/or some of the blocks described may be changed, eliminated, or combined. Similarly, additional operations may be included in the manufacturing process before, in between, or after the blocks shown in the illustrated examples.

In this description, the term "and/or" (when used in a form such as A, B and/or C) refers to any combination or subset of A, B, C, such as: (a) A alone; (b) B alone; (c) C alone; (d) A with B; (c) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Numerical identifiers such as "first", "second", "third", etc. are used merely to distinguish between elements of substantially the same type in terms of structure and/or function. These identifiers as used in the detailed description do not necessarily align with those used in the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. An apparatus comprising:
a first transistor having a first transistor terminal and a second transistor terminal;
a second transistor having a third transistor terminal and a fourth transistor terminal, the first third transistor terminal coupled to the first second transistor terminal;
a first resistor having a first resistor terminal and a second resistor terminal, the first resistor terminal coupled to the first transistor terminal, the second resistor terminal coupled to the second transistor terminal;
a second resistor having a third resistor terminal and a fourth resistor terminal, the third resistor terminal coupled to the third transistor terminal, the fourth resistor terminal coupled to the fourth transistor terminal;
a first diode having a first anode and a first cathode, the first anode coupled to the second transistor terminal and the first cathode coupled to the first transistor terminal; and
a second diode having a second anode and a second cathode, the second anode coupled to the third transistor terminal, and the second cathode coupled to the fourth transistor terminal.

2. The apparatus of claim 1, wherein the apparatus further comprising:
a third transistor having a fifth transistor terminal and a sixth transistor terminal, the sixth transistor terminal coupled to the first transistor terminal;
a third resistor having a fifth resistor terminal and a sixth resistor terminal, the fifth resistor terminal coupled to the fifth transistor terminal, the sixth resistor terminal coupled to the sixth transistor terminal;
a fourth transistor having a seventh transistor terminal and an eighth transistor terminal, the seventh transistor terminal coupled to the fourth transistor terminal;
a fourth resistor having a seventh resistor terminal and an eighth resistor terminal, the seventh resistor terminal coupled to the seventh transistor terminal, and the eighth resistor terminal coupled to the eighth transistor terminal;
a third diode having a third anode and a third cathode, the third anode coupled to the fifth transistor terminal, and the third cathode coupled to the sixth transistor terminal; and
a fourth diode having a fourth anode and a fourth cathode, the fourth anode coupled to the seventh transistor terminal, and the fourth cathode coupled to the eighth transistor terminal.

3. The apparatus of claim 1, wherein the first transistor further has a first transistor control terminal, the second transistor further has a second transistor control terminal, and the apparatus further comprising:
a third resistor having a fifth resistor terminal and a sixth resistor terminal, the fifth resistor terminal coupled to the first second transistor terminal and the third transistor terminal, and the sixth resistor terminal coupled to the first transistor control terminal and the second transistor control terminal.

4. The apparatus of claim 2, wherein the, the first transistor further has a first transistor control terminal, the second transistor has a second transistor control terminal, the third transistor has a third transistor control terminal, the fourth transistor has a fourth transistor control terminal, and the apparatus further comprising:
a fifth resistor having a ninth resistor terminal and a tenth resistor terminal, the ninth resistor terminal coupled to the second transistor terminal and the third transistor terminal, the tenth resistor terminal coupled to the first transistor control terminal and the second transistor control terminal;
a sixth resistor having an eleventh resistor terminal and a twelfth resistor terminal, the eleventh resistor terminal coupled to the sixth transistor terminal and the first transistor terminal, the twelfth resistor terminal coupled to the third transistor control terminal; and
a seventh resistor having a thirteenth resistor terminal and a fourteenth resistor terminal, the thirteenth resistor terminal coupled to the fourth transistor terminal and the seventh transistor terminal, the fourteenth resistor terminal coupled to the fourth transistor control terminal.

5. The apparatus of claim 3, the apparatus further comprising
a third diode having a third cathode, the third cathode coupled the sixth resistor terminal.

6. The apparatus of claim 4, the apparatus further comprising
a fifth diode having a fifth anode and a fifth cathode, the fifth cathode coupled the first transistor control terminal and the second transistor control terminal;
a sixth diode having a sixth anode and a sixth cathode, the sixth cathode coupled to the third transistor control terminal; and
a seventh diode having a seventh anode and a seventh cathode, the seventh cathode coupled to the fourth transistor control terminal, and the seventh anode coupled to the fifth anode and the sixth anode.

7. An apparatus comprising:
a first transistor having a first transistor terminal and a second transistor terminal;
a first resistor having a first resistor terminal and a second resistor terminal, the first resistor terminal coupled to the first transistor terminal, the second resistor terminal coupled to the second transistor terminal;

a second transistor having a third transistor terminal and a fourth transistor terminal, the third transistor terminal coupled to the second transistor terminal;

a second resistor having a third resistor terminal and a fourth resistor terminal, the third resistor terminal coupled to the third transistor terminal, the fourth resistor terminal coupled to the fourth transistor terminal; and a driver circuit, including:

a first voltage source coupled to the second transistor terminal and the third transistor terminal a first switch coupled to the first voltage source; and a switching control circuit coupled to the first switch.

8. The apparatus of claim 7, further comprising a clamping circuit having a first terminal, second terminal, third terminal, and a fourth terminal, the first terminal coupled to the first transistor terminal, the second terminal coupled to the second transistor terminal, the third terminal coupled to the third transistor terminal, and the fourth terminal coupled to the fourth transistor terminal.

9. The apparatus of claim 7, wherein the first transistor further has a first transistor control terminal and the second transistor has a second transistor control terminal, the apparatus further comprising:

a third resistor having a fifth resistor terminal and a sixth resistor terminal, the fifth resistor terminal coupled to the second transistor terminal and the third transistor terminal, the sixth resistor terminal coupled to the first transistor control terminal and the second transistor control terminal; and a first diode having a first anode and a first cathode, the first anode coupled to the to the first switch, the first cathode coupled to the sixth resistor terminal.

10. The apparatus of claim 8, wherein the clamping circuit further comprising:

a first diode having a first anode and a first cathode, the first anode coupled to the second transistor terminal, the first cathode coupled to the first transistor terminal; and a second diode having a second anode and a second cathode, the second anode coupled to the third transistor terminal, the second cathode coupled to the fourth transistor terminal.

11. The apparatus of claim 9, wherein the first transistor further has a second terminal, the system further comprising:

a third transistor having a fifth transistor terminal and a sixth transistor terminal, the sixth transistor terminal coupled to the first transistor terminal;

a fourth resistor having a seventh resistor terminal and an eighth resistor terminal, the seventh resistor terminal coupled to the fifth transistor terminal, the eighth resistor terminal coupled to the sixth transistor terminal;

a fourth transistor having a seventh transistor terminal and an eighth transistor terminal, the seventh transistor terminal coupled to the fourth transistor terminal; and a fifth resistor having a ninth resistor terminal and a tenth resistor terminal, the ninth resistor terminal coupled to the seventh resistor terminal, and the tenth resistor terminal coupled to the eighth transistor terminal.

12. The apparatus of claim 11, wherein the third transistor further has a third transistor control terminal and the fourth transistor further has a fourth transistor control terminal, the apparatus further comprising:

a sixth resistor having an eleventh resistor terminal and a twelfth resistor terminal, the eleventh resistor terminal coupled to the sixth transistor terminal and the first transistor terminal, the twelfth resistor terminal coupled to the third transistor control terminal;

a second diode having a second anode and a second cathode, the second anode coupled to the first anode, the second cathode coupled to the third transistor control terminal;

a seventh resistor having a thirteenth resistor terminal and a fourteenth resistor terminal, the thirteenth resistor terminal coupled to the fourth transistor terminal and the seventh resistor terminal, the fourteenth resistor terminal coupled to the fourth transistor control terminal; and a third diode having a third anode and a third cathode, the third anode coupled to the first anode, the third cathode coupled to the fourth transistor control terminal.

13. An apparatus comprising:

a first transistor having a first transistor terminal, a second transistor terminal, and a first transistor control terminal;

a first diode having a first anode and a first cathode, the first anode coupled to the second transistor terminal, and the first cathode coupled to the first transistor terminal;

a first resistor having a first resistor terminal and a second resistor terminal, the first resistor terminal coupled to the first transistor terminal, the second resistor terminal coupled to the second transistor terminal;

a second transistor having a third transistor terminal, a fourth transistor terminal, and a second transistor control terminal, the third transistor terminal coupled to the second transistor terminal;

a second diode having a second anode and a second cathode, the second anode coupled to the third transistor terminal, the second cathode coupled to the fourth transistor terminal;

a second resistor having a third resistor terminal and a fourth resistor terminal, the third resistor terminal coupled to the third transistor terminal, the fourth resistor terminal coupled to the fourth transistor terminal;

a third resistor having a fifth resistor terminal and a sixth resistor terminal, the fifth resistor terminal coupled to the second transistor terminal and the third resistor terminal, and the sixth resistor terminal coupled to the first transistor control terminal and the second transistor control terminal;

a third diode having a third anode and a third cathode, the third cathode coupled to the sixth resistor terminal;

a voltage source having a first voltage source terminal and a second voltage source terminal, the first voltage source terminal coupled to the second transistor terminal and the third transistor terminal; and a switch having a first switch terminal and a second switch terminal, the first switch terminal coupled to the second voltage source terminal, and the second switch terminal coupled to the third anode.

14. The apparatus of claim 7, wherein the driver circuit further includes a second voltage source coupled to the switching control circuit.

15. The apparatus of claim 14, wherein the switching control circuit opens the first switch when the voltage at the second voltage source is less than a threshold voltage.

16. The apparatus of claim 15, wherein the driver circuit further includes a second switch coupled to the switching control circuit and the second voltage source.

17. The apparatus of claim 13, further comprising:

a third transistor having a fifth transistor terminal, a sixth transistor terminal, and a third transistor control terminal, the sixth transistor terminal coupled to the first transistor terminal;

a fourth diode having a fourth anode and a fourth cathode, the fourth anode coupled to the sixth transistor terminal, the fourth cathode coupled to the fifth transistor terminal;

a fourth resistor having a seventh resistor terminal and an eighth resistor terminal, the seventh resistor terminal coupled to the fifth transistor terminal, the eighth resistor terminal coupled to the sixth transistor terminal;

a fifth resistor having a ninth resistor terminal and a tenth resistor terminal, the ninth resistor terminal coupled to the sixth transistor terminal and the first transistor terminal, the tenth resistor terminal coupled to the third transistor control terminal; and a fifth diode having a fifth anode and a fifth cathode, the fifth cathode coupled to the third transistor control terminal, the fifth anode coupled to the third anode.

18. The apparatus of claim 17, further comprising:

a fourth transistor having a seventh transistor terminal, an eighth transistor terminal, and a fourth transistor control terminal, the seventh transistor terminal coupled to the fourth transistor terminal;

a sixth diode having a sixth anode and a sixth cathode, the sixth anode coupled to the seventh transistor terminal, the sixth cathode coupled to the eighth transistor terminal;

a sixth resistor having an eleventh resistor terminal and a twelfth resistor terminal, the eleventh resistor terminal coupled to the seventh transistor terminal, the twelfth resistor terminal coupled to the eighth transistor terminal;

a seventh resistor having a thirteenth resistor terminal and a fourteenth resistor terminal, the thirteenth resistor terminal coupled to the fourth transistor terminal and the seventh transistor terminal, the fourteenth resistor terminal coupled to the fourth transistor control terminal; and a seventh diode having a seventh anode and a seventh cathode, the seventh cathode coupled to the fourth transistor control terminal, and the seventh anode coupled to the third anode.

* * * * *